(12) United States Patent
Suzuki et al.

(10) Patent No.: US 10,477,192 B2
(45) Date of Patent: Nov. 12, 2019

(54) DISPLAY SYSTEM AND ELECTRONIC DEVICE

(71) Applicant: Semiconductor Energy Laboratory Co., Ltd., Kanagawa-ken (JP)

(72) Inventors: Akio Suzuki, Kanagawa (JP); Naoto Kusumoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 128 days.

(21) Appl. No.: 15/702,170

(22) Filed: Sep. 12, 2017

(65) Prior Publication Data

US 2018/0077408 A1 Mar. 15, 2018

(30) Foreign Application Priority Data

Sep. 14, 2016 (JP) ................................ 2016-179155

(51) Int. Cl.
*H04N 13/31* (2018.01)
*H04N 13/156* (2018.01)
*H04N 13/351* (2018.01)
*H01L 27/32* (2006.01)
*G02B 27/22* (2018.01)
*H04N 13/32* (2018.01)
(Continued)

(52) U.S. Cl.
CPC ......... *H04N 13/31* (2018.05); *G02B 27/2214* (2013.01); *H01L 27/323* (2013.01); *H01L 27/3232* (2013.01); *H01L 27/3262* (2013.01); *H01L 27/3269* (2013.01); *H01L 27/3272* (2013.01); *H01L 29/786* (2013.01); *H04N 13/156* (2018.05); *H04N 13/32* (2018.05); *H04N 13/351* (2018.05); *G02F 1/137* (2013.01); *G02F 1/1368* (2013.01); *G02F 1/13338* (2013.01); *G02F 1/133514* (2013.01); *G02F 1/133528* (2013.01); *G02F 2201/44* (2013.01); *G02F 2203/02* (2013.01); *G02F 2203/09* (2013.01); *H01L 27/1225* (2013.01); *H01L 29/7869* (2013.01); *H04N 2213/001* (2013.01)

(58) Field of Classification Search
None
See application file for complete search history.

(56) References Cited

U.S. PATENT DOCUMENTS

2006/0244693 A1* 11/2006 Yamaguchi ......... G02F 1/13338
345/76
2011/0007390 A1* 1/2011 Yanamoto .......... G02B 27/2214
359/466

(Continued)

FOREIGN PATENT DOCUMENTS

JP 2011-141522 7/2011
JP 2012-237992 12/2012

*Primary Examiner* — Eileen M Adams
(74) *Attorney, Agent, or Firm* — Husch Blackwell LLP

(57) ABSTRACT

A display system which enables a stereoscopic image to be perceived by the naked eye is provided. The display system includes a display panel which can display a first image, a second image, a third image, and a fourth image. The first image has a region overlapping with the third image. The second image has a region overlapping with the fourth image. The first image and the third image are perceived by one of the right and left eyes and the second image and the fourth image are perceived by the other of the right and left eyes, so that a composite image of the first to fourth images is stereoscopically perceivable.

16 Claims, 20 Drawing Sheets

(51) Int. Cl.
   *H01L 29/786*  (2006.01)
   *G02F 1/1335*  (2006.01)
   *G02F 1/1368*  (2006.01)
   *G02F 1/137*   (2006.01)
   *H01L 27/12*   (2006.01)
   *G02F 1/1333*  (2006.01)

(56) References Cited

U.S. PATENT DOCUMENTS

| | | |
|---|---|---|
| 2011/0090183 A1 | 4/2011 | Yamazaki et al. |
| 2011/0242100 A1 | 10/2011 | Yamazaki et al. |
| 2012/0206325 A1 | 8/2012 | Yamazaki et al. |
| 2012/0274542 A1 | 11/2012 | Yamazaki et al. |
| 2013/0264549 A1 | 10/2013 | Yamazaki et al. |
| 2014/0140484 A1* | 5/2014 | Shiraki ............... A61B 6/4064 378/98 |
| 2015/0116202 A1* | 4/2015 | Kuroki .................. G06F 3/013 345/156 |
| 2016/0042696 A1 | 2/2016 | Hirakata et al. |
| 2016/0042702 A1 | 2/2016 | Hirakata et al. |
| 2016/0202583 A1* | 7/2016 | Jung ................ G02F 1/134336 257/72 |
| 2016/0202782 A1* | 7/2016 | Park ....................... G06F 3/044 345/173 |
| 2017/0061927 A1* | 3/2017 | Yoon ....................... G09G 3/20 |

\* cited by examiner

FIG. 3A
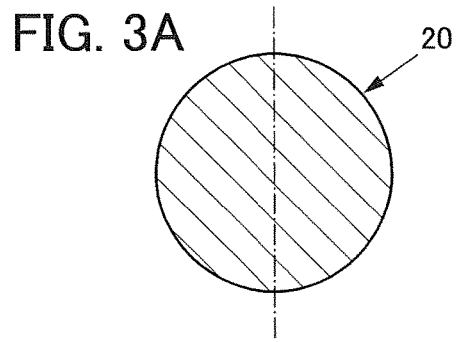
FIG. 3B1
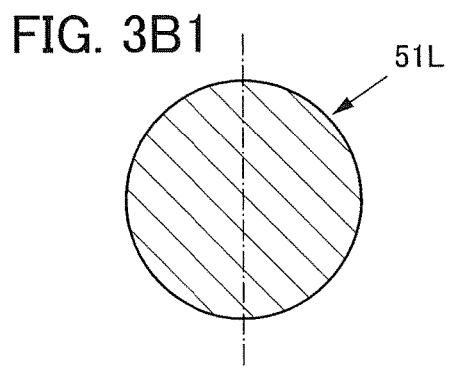
FIG. 3C1
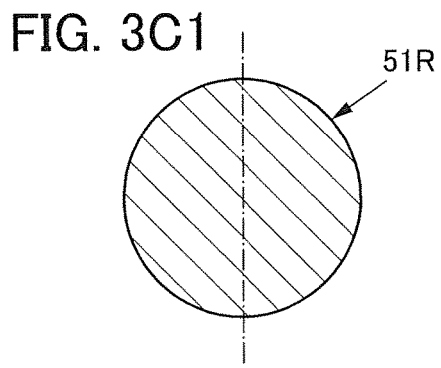
FIG. 3B2
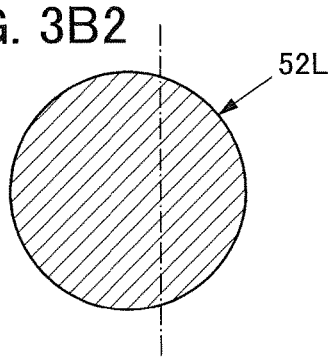
FIG. 3C2
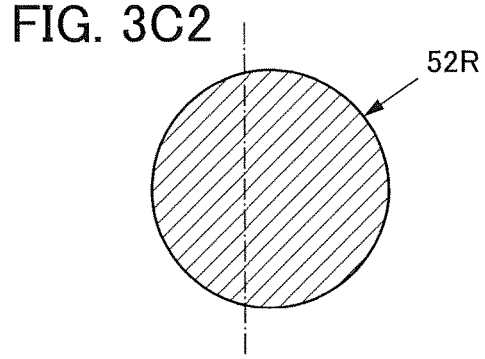
FIG. 3B3
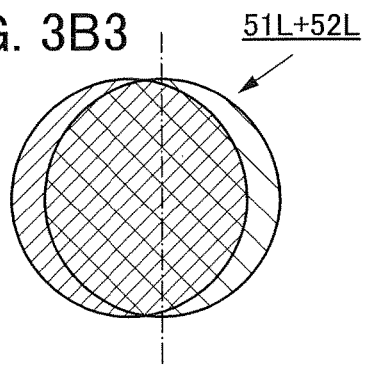
FIG. 3C3
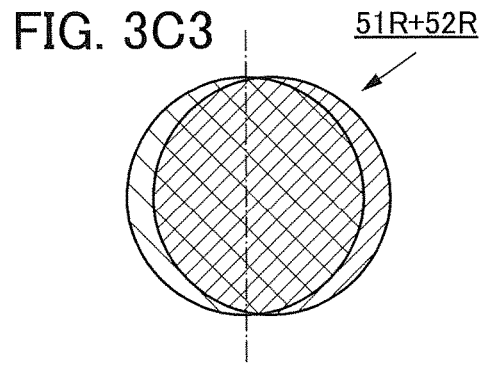

FIG. 4A1     FIG. 4B1
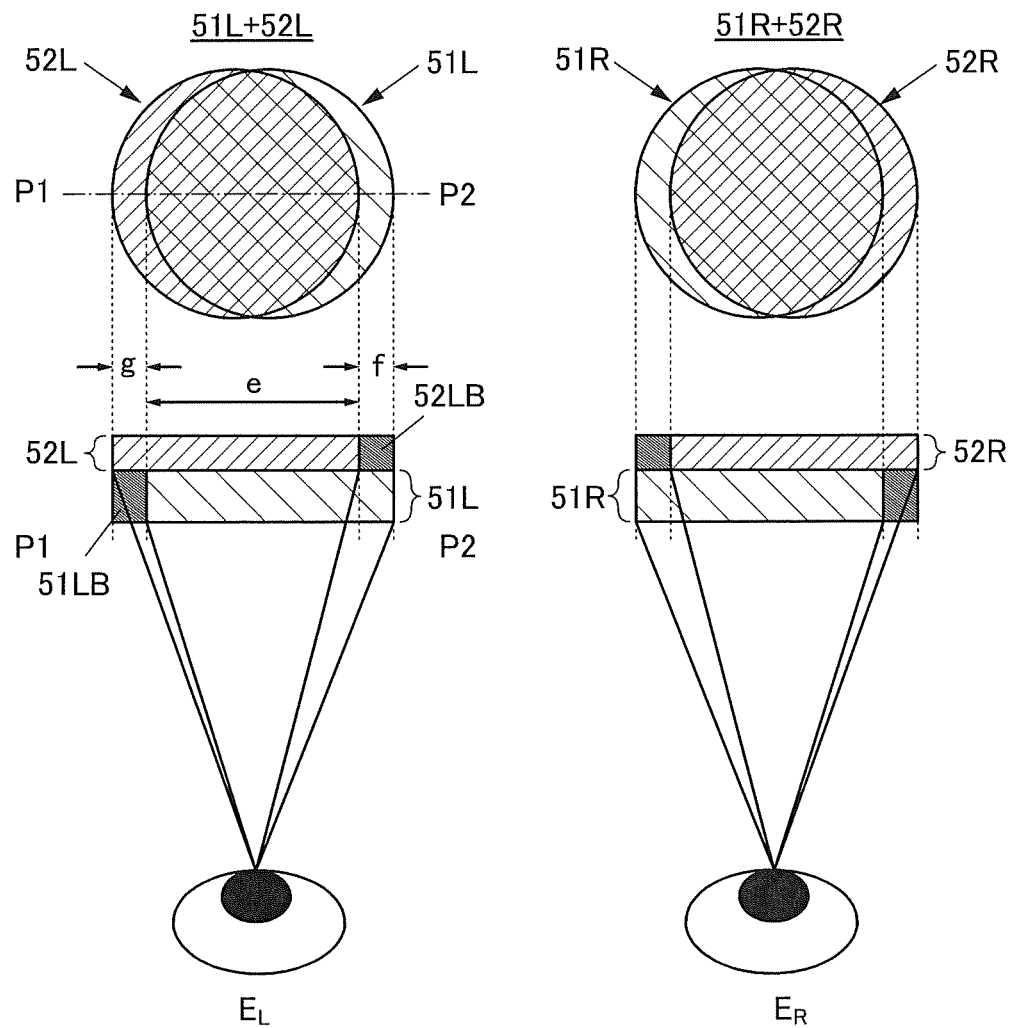
FIG. 4A2     FIG. 4B2
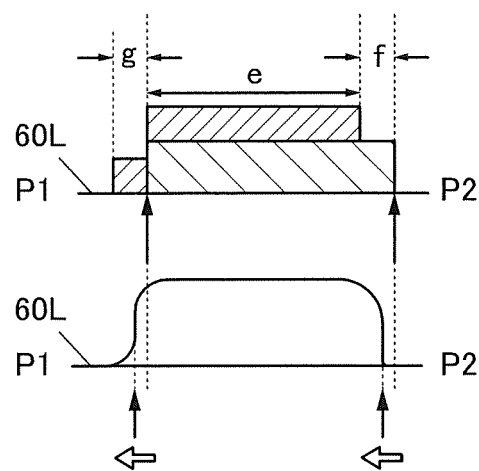
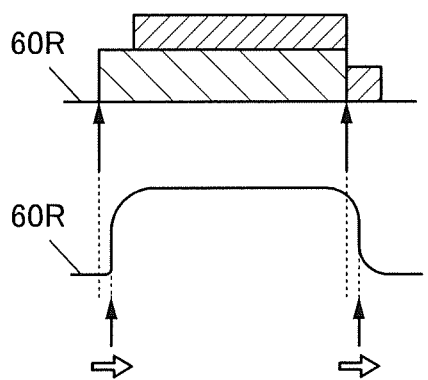

FIG. 8A
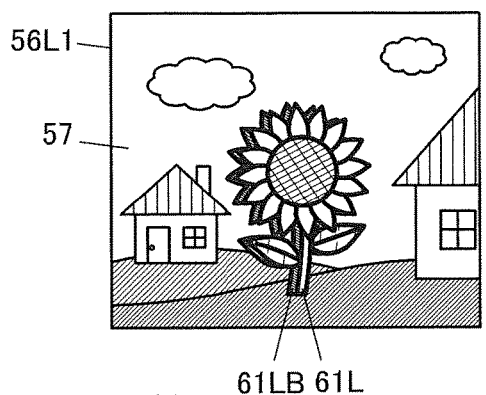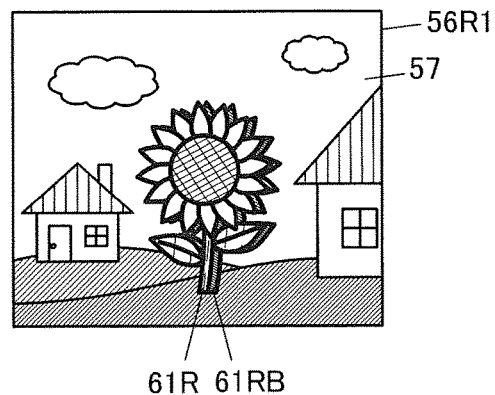
FIG. 8B
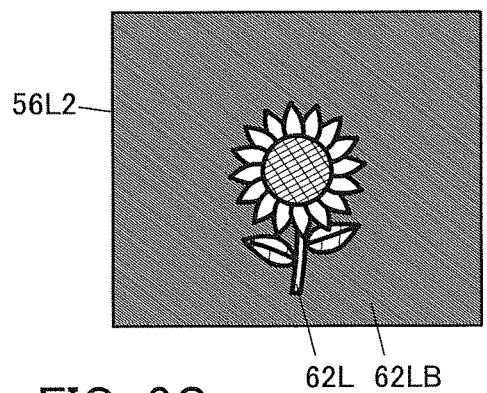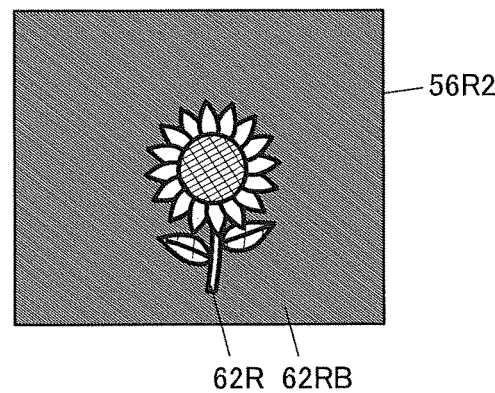
FIG. 8C
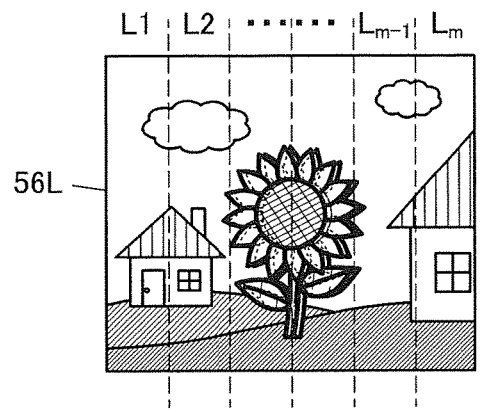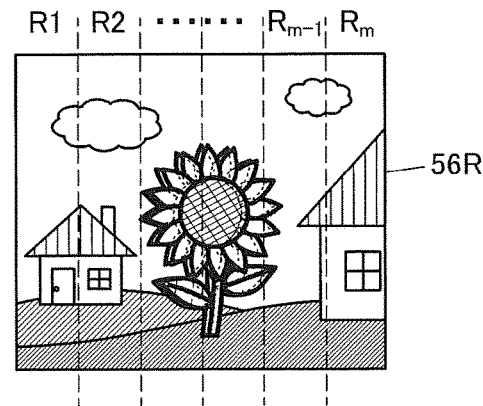

FIG. 13A
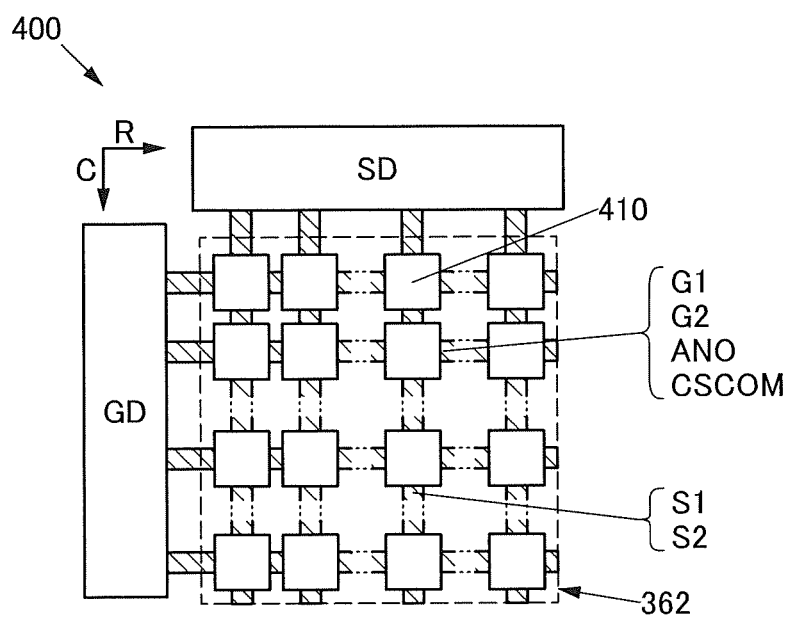
FIG. 13B1
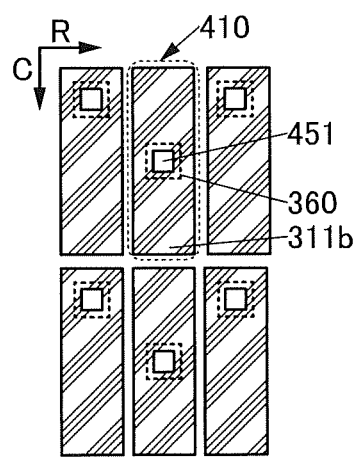
FIG. 13B2
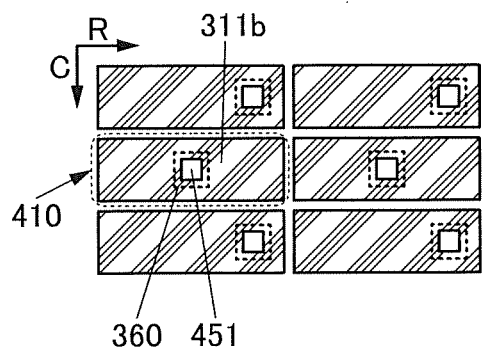

DISPLAY SYSTEM AND ELECTRONIC DEVICE

BACKGROUND OF THE INVENTION

1. Field of the Invention

The present invention relates to an object, a method, or a manufacturing method. The present invention relates to a process, a machine, manufacture, or a composition of matter. One embodiment of the present invention particularly relates to a semiconductor device, a light-emitting device, a display device, an electronic device, a lighting device, a driving method thereof, or a manufacturing method thereof. In particular, one embodiment of the present invention relates to a display device (display panel) capable of displaying an image on a curved surface. Another embodiment of the present invention relates to an electronic device, a light-emitting device, or a lighting device which includes a display device capable of displaying an image on a curved surface, or a manufacturing method thereof.

In this specification and the like, a semiconductor device generally means a device that can function by utilizing semiconductor characteristics. A transistor, a semiconductor circuit, an arithmetic device, a memory device, and the like are each one embodiment of the semiconductor device. A light-emitting device, a display device, a lighting device, and an electronic device may each include a semiconductor device.

2. Description of the Related Art

Recent widespread use of electronic devices such as smartphones and tablet terminals gives more and more opportunities for outdoor data communication. Furthermore, in the field of display devices included in information terminals, techniques for reducing power consumption have been competitively developed to achieve long-time operation with a limited battery capacity. For example, Patent Document 1 discloses a low-power liquid crystal display device in which a transistor including an oxide semiconductor and having low off-state current is used for a pixel to retain an image signal for a long time.

REFERENCE

[Patent Document]

[Patent Document 1] Japanese Published Patent Application No. 2011-141522

SUMMARY OF THE INVENTION

An electronic device including a display device is expected to be capable of displaying a high-resolution image. It is also expected that a stereoscopic image which can be perceived by the naked eye can be displayed.

In the case where a composite image of a plurality of images is displayed, a so-called augmented reality (AR) technology is used. The AR technology enables information to be additionally displayed on part of an object.

By the AR technology, data of a captured image and computer graphics (CG) data generated by software are combined, and the composite image can be displayed on a display device.

More variety of images can be displayed on an electronic device in which the AR technology is combined with the 3D display technology that enables a stereoscopic image to be perceived by the naked eye.

In view of the above, an object of one embodiment of the present invention is to provide a display system capable of displaying a stereoscopic image which can be perceived by the naked eye. Another object is to provide a display system capable of displaying a composite image of a plurality of images. Another object is to provide a display system with low power consumption. Another object is to provide a novel display system. Another object is to provide an electronic device including the display system. Another object is to provide a novel electronic device.

Note that the description of these objects does not disturb the existence of other objects. One embodiment of the present invention does not necessarily achieve all the objects. Other objects will be apparent from and can be derived from the description of the specification and the like.

One embodiment of the present invention relates to a display system including a display device that has a function of emitting visible light and a function of reflecting visible light. Another embodiment of the present invention relates to an electronic device including the display system.

One embodiment of the present invention is a display system including a display panel capable of displaying a first image, a second image, a third image, and a fourth image. The first image has a region overlapping with the third image. The second image has a region overlapping with the fourth image. The first image and the third image are perceived by one of the right and left eyes and the second image and the fourth image are perceived by the other of the right and left eyes, so that a composite image of the first to fourth images is stereoscopically perceivable.

Another embodiment of the present invention is a display system including a display panel which includes a first pixel, a second pixel, and a shielding layer and is capable of displaying a first image, a second image, a third image, and a fourth image. The first pixel is adjacent to the second pixel. The first pixel includes a first display element and a third display element. The second pixel includes a second display element and a fourth display element. The first display element is configured to display part of the first image. The second display element is configured to display part of the second image. The third display element is configured to display part of the third image. The fourth display element is configured to display part of the fourth image. The shielding layer is apart from the first pixel and the second pixel. The shielding layer has a region overlapping with the first pixel when seen from a first angle. The shielding layer has a region overlapping with the second pixel when seen from a second angle. The first image has a region overlapping with the third image. The second image has a region overlapping with the fourth image. The first pixel is perceived by one of the right and left eyes and the second pixel is perceived by the other of the right and left eyes, so that a composite image of the first to fourth images is stereoscopically perceivable.

The following configuration is preferable: the first to fourth images are similar to each other; the first image has a region which overlaps but is not aligned with the third image; and the second image has a region which overlaps but is not aligned with the fourth image.

The following configuration is preferable: in a region in which the first image is displayed and does not overlap with the third image, the third display element displays black; in a region in which the third image is displayed and does not overlap with the first image, the first display element displays black; in a region in which the second image is displayed and does not overlap with the fourth image, the fourth display element displays black; and in a region in which the fourth image is displayed and does not overlap with the second image, the second display element displays black.

The first display element and the second display element can each have a function of reflecting visible light, and the third display element and the fourth display element can each have a function of emitting visible light.

It is preferable that the first to fourth display elements each be electrically connected to a transistor including a metal oxide in a semiconductor layer in which a channel is formed.

In this specification, the display device may include the following modules in its category: a module in which a connector such as a flexible printed circuit (FPC) or a tape carrier package (TCP) is attached to a display element; a module having a TCP provided with a printed wiring board at the end thereof; and a module having an integrated circuit (IC) directly mounted by a chip on glass (COG) method over a substrate over which a display element is formed.

According to one embodiment of the present invention, a display system capable of displaying a stereoscopic image which can be perceived by the naked eye can be provided. Furthermore, a display system capable of displaying a composite image of a plurality of images can be provided. Furthermore, a display system with low power consumption can be provided. Furthermore, a novel display system can be provided. Furthermore, an electronic device including the display system can be provided. Furthermore, a novel electronic device can be provided.

Note that the description of these effects does not disturb the existence of other effects. One embodiment of the present invention does not necessarily have all the effects. Other effects will be apparent from and can be derived from the description of the specification, the drawings, the claims, and the like.

BRIEF DESCRIPTION OF THE DRAWINGS

FIGS. 3A, 3B1 to 3B3, and 3C1 to 3C3 illustrate a depth-fused 3D display method.

FIGS. 4A1, 4A2, 4B1, and 4B2 illustrate a principle of a depth-fused 3D display method which enables a stereoscopic image to be perceived.

FIGS. 8A to 8C illustrate a procedure for producing a 3D display image.

FIG. 13A illustrates a circuit of a display device, and FIGS. 13B1 and 13B2 are top views of pixels.

DETAILED DESCRIPTION OF THE INVENTION

Figure 1:
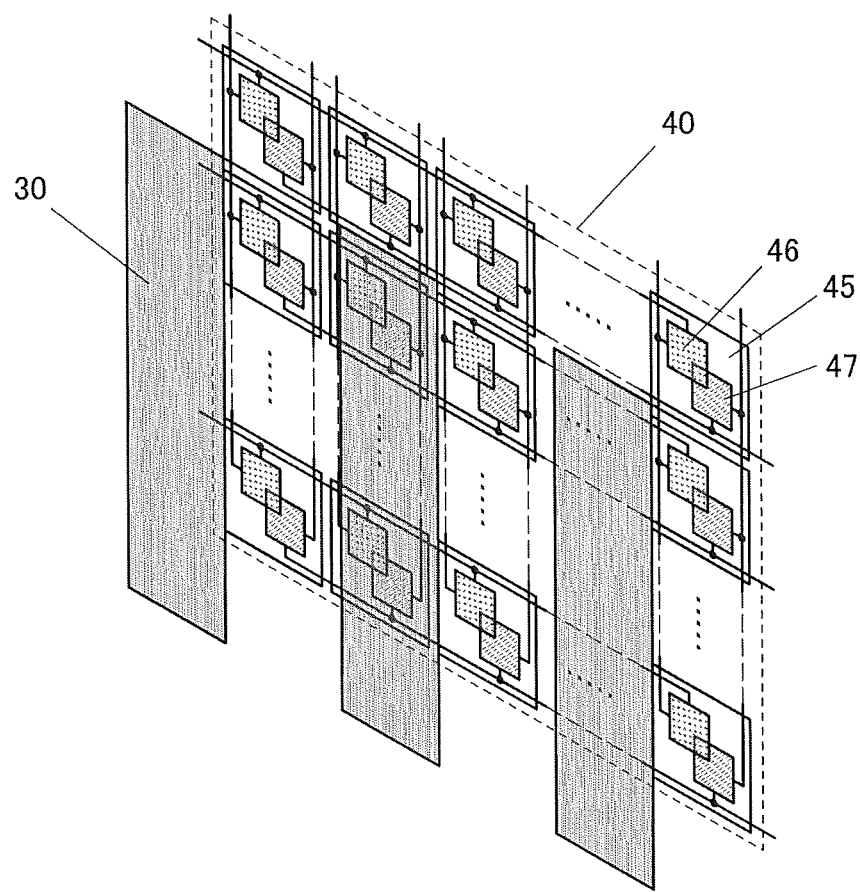
FIG. 1 illustrates a display panel.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of the embodiments below.

In the structures of the invention described below, the same portions or portions having similar functions are denoted by the same reference numerals in different drawings, and repetitive description thereof will be omitted. Furthermore, the same hatching pattern is used for portions having similar functions, and the portions are not especially denoted by reference numerals in some cases.

In each drawing referred to in this specification, the size, the layer thickness, or the region of each component is exaggerated for clarity in some cases. Therefore, embodiments of the present invention are not limited to such a scale.

In this specification and the like, ordinal numbers such as "first" and "second" are used in order to avoid confusion among components and do not limit the components numerically.

Embodiment 1

In this embodiment, a display system which is one embodiment of the present invention and enables a stereoscopic image to be perceived by the naked eye will be described with reference to drawings.

In a display panel of one embodiment of the present invention, a first display element and a second display element are provided in one pixel unit; therefore, a plurality of images can be displayed so as to overlap with each other. Such a display method enables a combination of a parallax barrier 3D display method and a depth-fused 3D display method. Accordingly, a more stereoscopic image can be displayed.

A display device used for the display system of one embodiment of the present invention includes a display panel which can display a first image, a second image, a third image, and a fourth image. The first image and the third image are displayed so as to overlap with each other. The second image and the fourth image are displayed so as to overlap with each other.

Through a parallax barrier, a viewer perceives the first image and the third image with one of the right and left eyes and perceives the second image and the fourth image with the other of the right and left eyes, so that the viewer can perceive a composite image of the first to fourth images as stereoscopic.

FIG. 1 illustrates a pixel array 40 and some shielding layers 30 which are included in the display panel of one embodiment of the present invention. The pixel array 40 includes a plurality of pixel units 45 arranged in a matrix. The pixel unit 45 includes a pixel 46 and a pixel 47.

Here, the pixel 46 includes a first display element, and the pixel 47 includes a second display element. For example, a reflective liquid crystal element can be used as the first display element. For example, a light-emitting element can be used as the second display element.

The higher the intensity of external light is, the higher the visibility of a reflective liquid crystal element is. In addition, since no backlight is used, the power consumption is low. A light-emitting element is a display element having high visibility in an environment with a relatively low illuminance (e.g., an outdoor environment at night or an indoor environment under interior light). That is, the reflective liquid crystal element is driven in a high-illuminance environment and the light-emitting element is driven in a low-illuminance environment, whereby a display panel which has low power consumption and high visibility regardless of the ambient illuminance can be obtained.

Furthermore, different image signals can be input to the pixel 46 and the pixel 47 in the same pixel unit 45. Therefore, the display panel can perform display that is delicate enough for 3D display.

The shielding layers 30 are band-like layers for blocking visible light and can function as a parallax barrier. The shielding layers 30 are arranged at intervals A in the horizontal direction of the display panel (in the direction in which human eyes are arranged). For example, the interval A can be the horizontal length of one pixel. Furthermore, each of the shielding layers 30 is provided at an interval B from the pixel units 45. For example, the interval B can be the length of a region in which one shielding layer 30 overlaps with all the pixel units 45 in a certain column when seen from a certain direction.

Figure 2A:
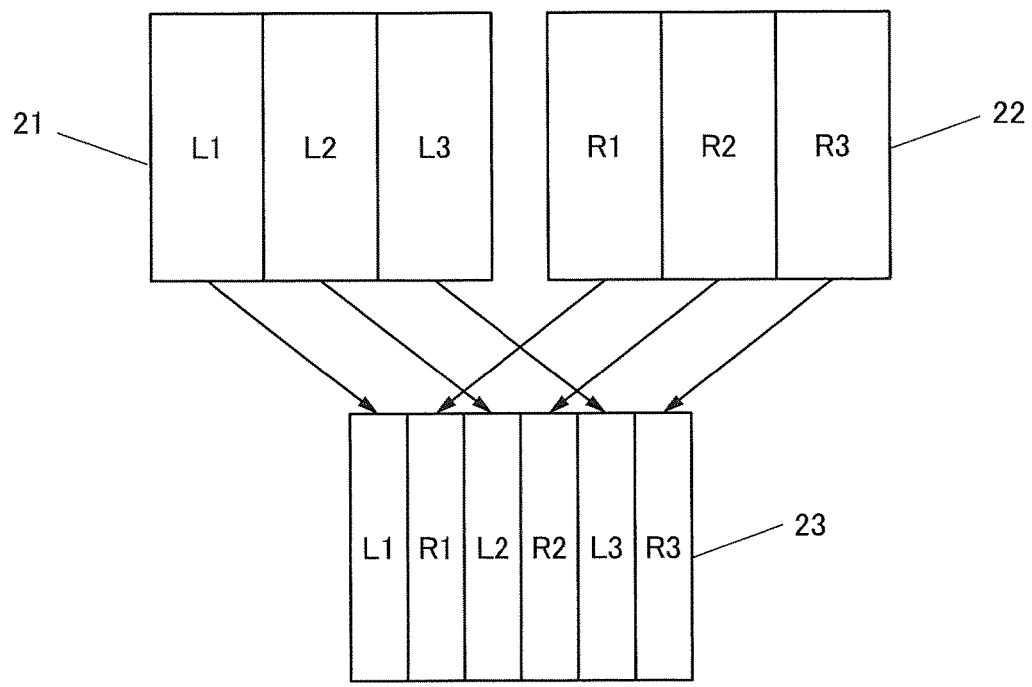
FIGS. 2A and 2B illustrate a parallax barrier 3D display method.

FIG. 2A illustrates a parallax barrier 3D display method. In the parallax barrier 3D display method, a left-eye image 21 and a right-eye image 22 are needed. Images L1 to L3 are formed by dividing the left-eye image 21 into a plurality of pieces, and images R1 to R3 are formed by dividing the right-eye image 22 into a plurality of pieces. Then, these images are alternately arranged to form an image 23.

Figure 2B:
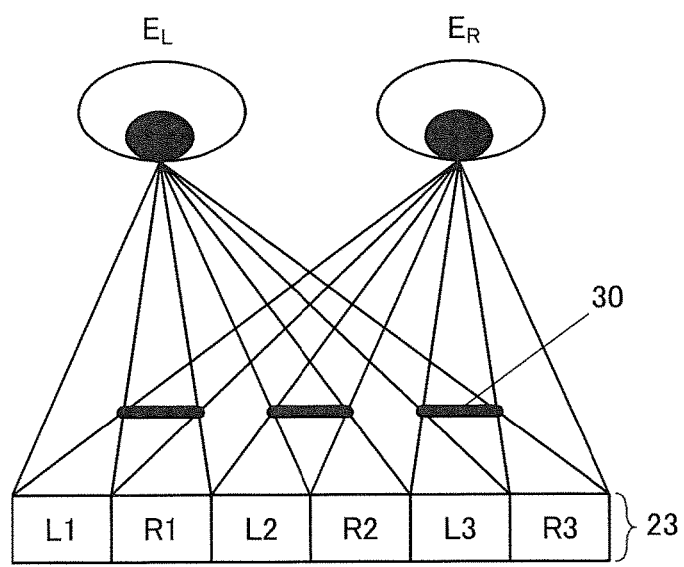

As illustrated in FIG. 2B, the viewer sees the image 23 through the parallax barrier (regions between the shielding layers 30); the left eye $E_L$ perceives the left-eye image, i.e. the images L1 to L3, and the right eye $E_R$ perceives the right-eye image, i.e. the images L1 to L3. Thus, the viewer can recognize the image 23 as a 3D image.

FIGS. 3A, 3B1 to 3B3, and 3C1 to 3C3 illustrate an example in which the display panel of one embodiment of the present invention is used to perform display by a depth-fused 3D display method. Note that a conventional depth-fused 3D display method requires two display panels. One of the two display panels is located at an interval behind the other, and similar images are displayed on the display panels. Thus, both eyes of the viewer perceive a region in which the images overlap with each other and a region in which the images do not overlap with each other, so that the composite image of the two images can be perceived as stereoscopic.

In contrast, in the method of one embodiment of the present invention, one display panel enables a stereoscopic image to be perceived in a manner similar to that described above. Consequently, the size of the display device can be reduced.

An image 20 illustrated in FIG. 3A is a 2D image. In actuality, the image 20 is obtained by capturing an image of a columnar or spherical object, i.e. an object with depth.

An image 51L illustrated in FIG. 3B1 corresponds to the above-mentioned first image, and an image 51R illustrated in FIG. 3C1 corresponds to the above-mentioned second image. The image 51L and the image 51R can be the same as the image 20.

Here, the image 51L is a left-eye image, and the image 51R is a right-eye image. Through the above-described parallax barrier, the left-eye image and the right-eye image can be perceived by the respective eyes.

An image 52L illustrated in FIG. 3B2 corresponds to the above-mentioned third image, and an image 52R illustrated in FIG. 3C2 corresponds to the above-mentioned fourth image. The image 51L and the image 52L have substantially the same size and similar shapes. As illustrated in FIG. 3B3, the image 51L and the image 52L are displayed so as to partly overlap with each other. The image 51R and the image 52R have substantially the same size and similar shapes. As illustrated in FIG. 3C3, the image 51R and the image 52R are displayed so as to partly overlap with each other.

At this time, as illustrated in FIG. 3B3, the image 51L and the image 52L are displayed so as to overlap but be horizontally misaligned with each other. As illustrated in FIG. 3C3, the image 51R and the image 52R are displayed so as to overlap but be horizontally misaligned with each other.

Here, the image 51L and the image 51R are assumed to be front views of the object, and the image 52L and the image 52R are assumed to be views at the back of the object. The image 51L and the image 51R are arranged in front of the image 52L and the image 52R so as to overlap with the image 52L and the image 52R without misalignment when seen from the front. When the image 51L and the image 52L are seen by one eye from the front, only the image 51L can be perceived because the image 51L overlaps with the whole image 52L. However, when seen obliquely from the left (from the position of the left eye), part of the image 52L can be seen on the left of the image 51L. Therefore, the image 52L, which is the left-eye image, is displayed in a position shifted leftward from the position of the image 51L. Similarly, the image 52R, which is the right-eye image, is displayed in a position shifted rightward from the position of the image 51R.

The image 51L and the image 51R are displayed by one of the pixels 46 and 47. The image 52L and the image 52R are displayed by the other of the pixels 46 and 47. Accordingly, the image 51L and the image 52L can be displayed so as to partly overlap with each other. Similarly, the image 51R and the image 52R can be displayed so as to partly overlap with each other. In this embodiment, the image 51L and the image 51R are displayed by the pixel 46, and the image 52L and the image 52R are displayed by the pixel 47.

Furthermore, the image 51L preferably has a higher luminance than the image 52L. Similarly, the image 51R preferably has a higher luminance than the image 52R. In this manner, the luminance of the front images is increased relative to the luminance the images at the back, whereby the viewer can perceive the object as being located closer.

Such a display method enables the viewer to perceive stereoscopic display by seeing the images in FIG. 3B3 with the left eye and the images in FIG. 3C3 with the right eye.

Next, a principle for why a stereoscopic image can be perceived in the above manner will be described in detail.

FIGS. 4A1 and 4B1 illustrate a manner in which the images in FIGS. 3B3 and 3C3 are perceived by the right and left eyes. In the case where the image 51L, the image 52L, the image 51R and the image 52R are divided in the manner described with reference to FIG. 2A, the images have the configurations illustrated in FIG. 5.

FIG. 4A1 illustrates, from the top, information on the positions where the image 51L and the image 52L are displayed, information in the depth direction of the image 51L and the image 52L along line P1-P2, and the positional information of the left eye $E_L$. In the drawing, the height in the information in the depth direction represents the luminance of the image; the larger the height is, the higher the luminance is.

As mentioned above, the image 51L and the image 52L are displayed by the pixel 46 and the pixel 47, respectively. The distance in the depth direction between the pixel 46 and the pixel 47, which are formed so as to partly overlap with each other in the pixel unit 45, is several micrometers at most. Therefore, the image 51L and the image 52L can be regarded as being displayed on substantially the same plane. However, in the following description, the image 51L displayed by the pixel 46 is located in front (closer to the left eye $E_L$), and the image 52L displayed by the pixel 47 is located at the back (farther from the left eye $E_L$).

As illustrated in FIG. 4A1, the left eye $E_L$ perceives a region e in which the image 51L and the image 52L overlap with each other, a region f which is an end portion of the image 51L, and a region g which is an end portion of the image 52L. In the horizontal direction, the region f and the region g each preferably have a width corresponding to the length of 1 or more and 100 or less pixels, further preferably 2 or more and 50 or less pixels, still further preferably 4 or more and 25 or less pixels. When the widths of the region f and the region g are set as above, the viewer can perceive the images as stereoscopic. Note that optimal values depend on the resolution of the display panel and the eyesight and spectral sensitivity of the viewer; therefore, the widths of the region f and the region g are preferably controllable on the display panel so that the viewer can feel comfortable with the display.

The region e has the highest luminance, the region f has the second-highest luminance, and the region g has the lowest luminance In the region f, while the pixel 46 displays the image 51L, the pixel 47 provided in the same pixel unit 45 as the pixel 46 displays a black image 52LB. In the region g, while the pixel 47 displays the image 52L, the pixel 46 provided in the same pixel unit 45 as the pixel 47 displays a black image 51LB. In this manner, the region f and the region g are prevented from overlapping with other images.

Outside the region f and the region g, one of the pixels 46 and 47 may display a background image or the like. In this case, the other of the pixels 46 and 47 displays a black image. Alternatively, the pixel 46 and the pixel 47 may each display a background image or the like.

The upper part of FIG. 4A2 schematically illustrates luminance information of the region e, the region f, and the region g, which is given to a retina 60L of the left eye $E_L$. Note that, in actuality, information in the vicinity of the end portions is rounded up or down or averaged, for example, and given to the retina 60L of the left eye $E_L$ as illustrated in the lower part of the drawing. Therefore, on the retina 60L, end portions (positions where the luminance largely changes) of the image formed by the overlap of the image 51L and the image 52L are slightly shifted leftward from those in the above schematic view.

Similarly, as illustrated in FIG. 4B1, the right eye $E_R$ perceives an image formed by the overlap of the image 51R and the image 52R. As illustrated in the lower part of FIG. 4B2, on a retina 60R of the right eye $E_R$, end portions of the image formed by the overlap of the image 51R and the image 52R are slightly shifted rightward in contrast to the end portions of the image delivered to the retina 60L.

In this manner, the right and left eyes perceive images whose end portions are shifted in different directions, which enables the viewer to see a stereoscopic image.

Figure 6:
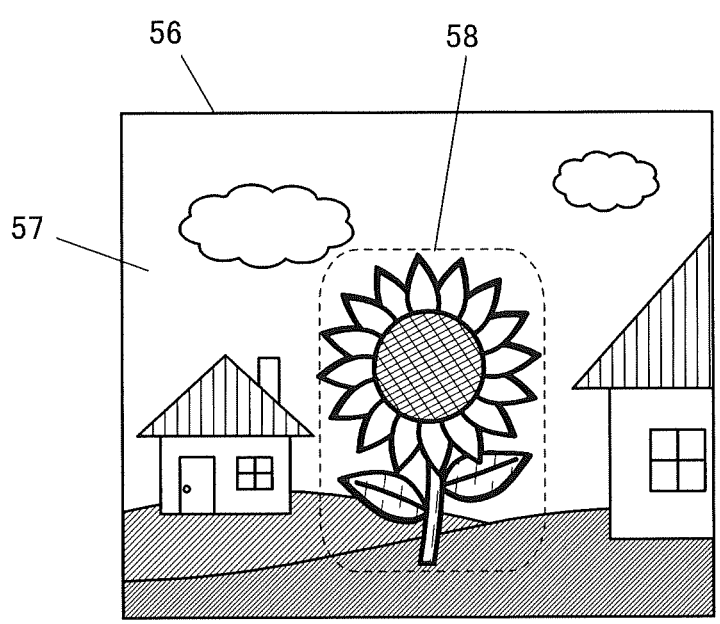
FIG. 6 illustrates a 3D display image.

Next, a specific example in which a 3D image is displayed will be described. FIG. 6 shows an example in which part of an image is three-dimensionally displayed. An image 56 is a composite image of a background image 57 (an image including a house, the sky, a cloud, and the like) and a plant image 58. The drawing illustrates the state which is actually perceived by the viewer.

In one embodiment of the present invention, a 2D image is processed and displayed by a depth-fused 3D display method; therefore, an image to be displayed three-dimensionally is preferably specified in advance. For example, the object to be displayed three-dimensionally can be a CG image used for the AR technology. In the image 56, the plant image 58 is the object to be displayed three-dimensionally.

A procedure for producing the image 56 will be described with reference to FIGS. 7A to 7C and FIGS. 8A to 8C. Note that an image described below can be, for example, an image recorded in a recording medium in advance, an image obtained by data communication, or an image captured on-site by a camera.

Figure 7A:
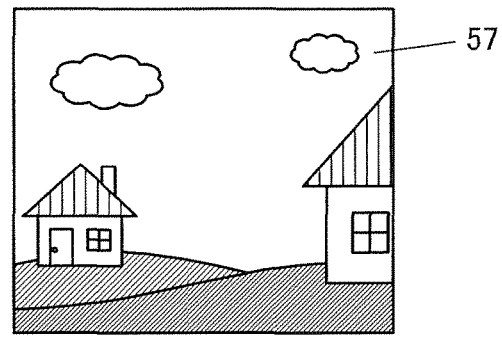
FIGS. 7A to 7C illustrate a procedure for producing a 3D display image.
Figure 7B:
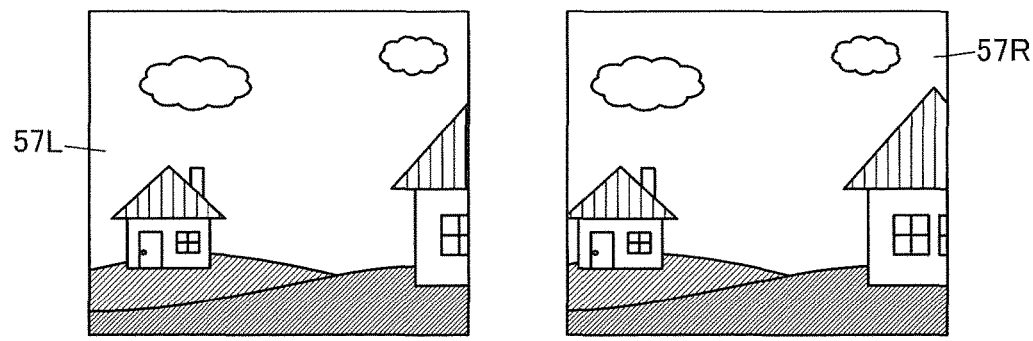

First, the background image 57 illustrated in FIG. 7A is obtained. Alternatively, as illustrated in FIG. 7B, a left-eye image 57L and a right-eye image 57R may be obtained as background images. Since a parallax barrier is used in one embodiment of the present invention, the background image can also be three-dimensionally displayed using the left-eye and right-eye background images.

Figure 7C:
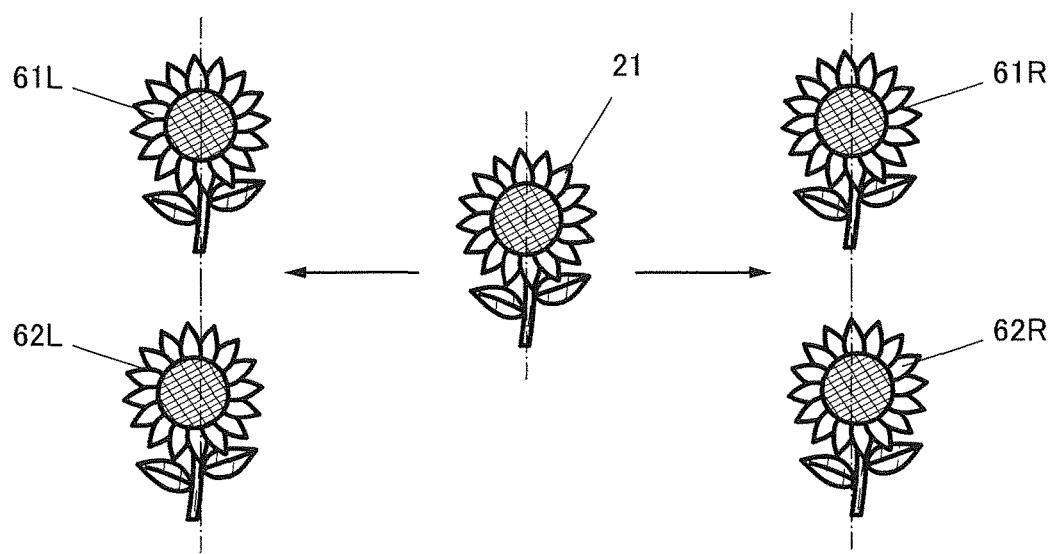

Next, the image 21 to be displayed three-dimensionally is obtained and processed to form an image 61L, an image 62L, an image 61R, and an image 62R (see FIG. 7C). Note that the image 21, the image 61L, the image 62L, the image 61R, and the image 62R correspond to the image 20, the image 51L, the image 52L, the image 51R, and the image 52R, respectively, which are illustrated in FIGS. 3A, 3B1 to 3B3, and 3C1 to 3C3.

Subsequently, as illustrated in FIG. 8A, the background image 57, the image 61L, and an image 61LB are combined to form a left-eye image 56L1. Here, the image 61LB is a black image displayed in a region which overlaps with the image 62L and does not overlap with the image 61L and corresponds to the image 51LB illustrated in FIG. 4A1. Furthermore, the background image 57, the image 61R, and an image 61RB are combined to form a right-eye image 56R1. The image 61RB is a black image displayed in a region which overlaps with the image 62R and does not overlap with the image 61R.

Furthermore, as illustrated in FIG. 8B, the image 62L and an image 62LB are combined to form a left-eye image 56L2. Here, the image 62LB is a black image displayed in a region which does not overlap with the image 62L and corresponds to the image 52LB illustrated in FIG. 4A1 and an image displayed outside the image 52L and the image 52LB. Furthermore, the image 62R and an image 62RB are combined to form a right-eye image 56R2. The image 62RB is a black image displayed in a region which does not overlap with the image 62R.

Here, the image 56L1 and the image 56R1 illustrated in FIG. 8A are displayed by the pixel 46. The image 56L2 and the image 56R2 illustrated in FIG. 8B are displayed by the pixel 47. However, the image 56L1 and the image 56R1 may be displayed by the pixel 47, and the image 56L2 and the image 56R2 may be displayed by the pixel 46.

Figure 5:
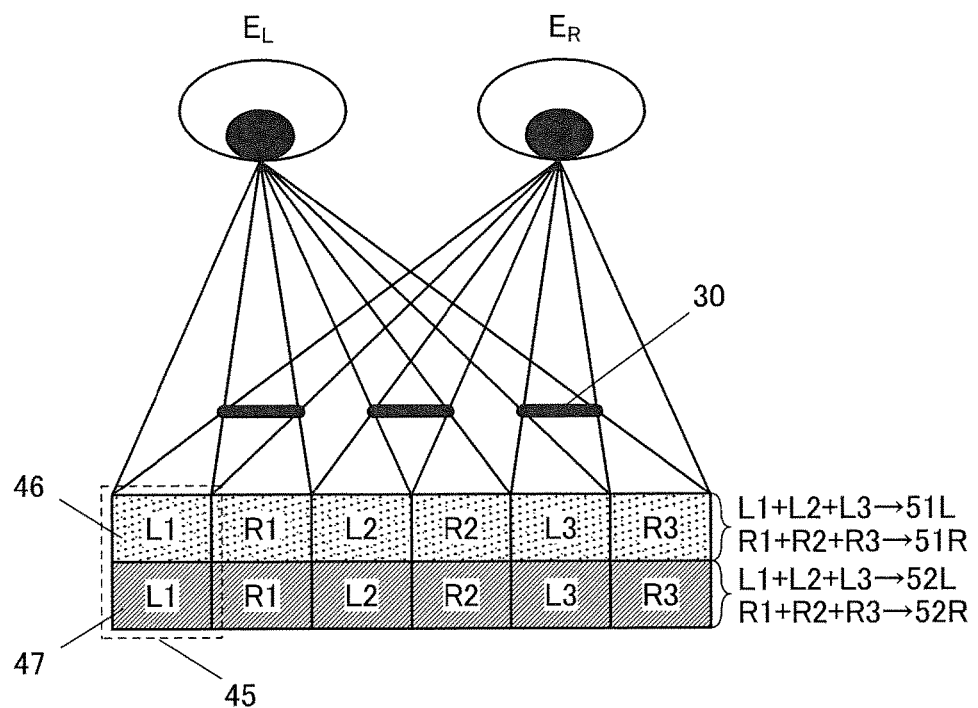
FIG. 5 illustrates a parallax barrier 3D display method.

FIG. 8C illustrates an image 56L and an image 56R which are actually displayed on the display panel. To produce a left-eye image for a parallax barrier, the image 56L is divided into images $L_1$ to $L_m$. To produce a right-eye image for the parallax barrier, the image 56R is divided into images $R_1$ to $R_m$. Here, m can be less than or equal to half the number of pixels arranged in the horizontal direction of the display panel and can be equal to the number of shielding layers of the parallax barrier. Then, as illustrated in FIG. 5, the left-eye images and the right-eye images are alternately arranged to be displayed.

Figure 9:
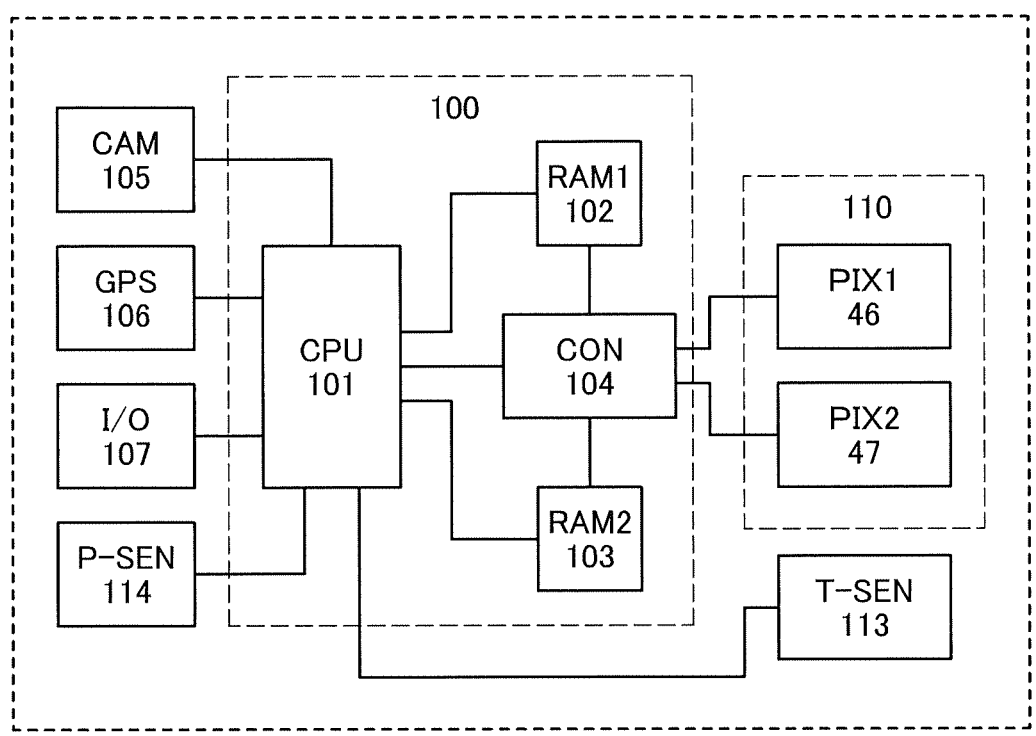
FIG. 9 is a block diagram illustrating a display system.

FIG. 9 is a block diagram illustrating a display system of one embodiment of the present invention. A display system 10 illustrated in FIG. 9 can include a data processing portion 100, a display portion 110, a camera 105 (CAM), a global positioning system (GPS) receiver 106 (GPS), a data input/output portion 107 (I/O), a touch sensor 113 (T-SEN), and a photosensor 114 (P-SEN). Components included in the display system 10 are not limited thereto, and other components may be included.

The data processing portion 100 can include a data processing circuit 101 (CPU), a first memory 102 (RAM1), a second memory 103 (RAM2), and a control circuit 104 (CON).

As the data processing circuit 101, an arithmetic circuit such as a central processing unit (CPU) can be used. The data processing circuit 101 has a function of controlling the entire display system 10 by, for example, receiving/transmitting signals as necessary from/to the first memory 102, the second memory 103, the control circuit 104, the camera 105, the GPS receiver 106, the data input/output portion 107, the touch sensor 113, the photosensor 114, and the like.

The first memory 102 and the second memory 103 each have a function of storing image data. For example, as a frame memory, the first memory 102 and the second memory 103 each retain image data and enable data reception/transmission between the data processing circuit 101 and the control circuit 104. In addition, the first memory 102 and the second memory 103 each retain data of a plurality of frames to enable processing such as image data comparison between frames.

The first memory 102 has a function of storing image data displayed by the first display element.

The second memory 103 has a function of storing image data displayed by the second display element.

The control circuit 104 has a function of controlling the operation of the display portion 110 in accordance with the frequency of updating the two kinds of image data.

The display portion 110 includes the pixel 46 (PIX1) with the first display element and the pixel 47 (PIX2) with the second display element. As described above, for example, a reflective liquid crystal element can be used as the first display element. For example, a light-emitting element can be used as the second display element. Note that the pixel 46 and the pixel 47 can include the second display element and the first display element, respectively.

Each of the pixels 46 and 47 preferably has a transistor whose channel region includes a metal oxide (hereinafter referred to as an OS transistor) as a transistor for image data writing. The OS transistor has an extremely low off-state current and can retain a potential written as image data for a long time. Thus, a displayed image can be maintained for a plurality of frame periods without rewriting of image data; that is, so-called idling stop driving is available.

The idling stop driving enables retention of image data written to a pixel for two or more frames. This can reduce the frequency of rewriting the image data and thus lower the power consumption.

A reflective liquid crystal element that can be used as the first display element does not need a backlight, and accordingly, the power consumption of the pixel portion is equivalent to the power consumption by circuit operation. Thus, the pixel with the first display element is particularly preferably subjected to the idling stop driving. In this case, the power consumption of the pixel portion can be reduced in proportion to the rewriting frequency.

An example of the above-mentioned idling stop driving will be described with reference to FIGS. 10A to 10C.

Figure 10A:
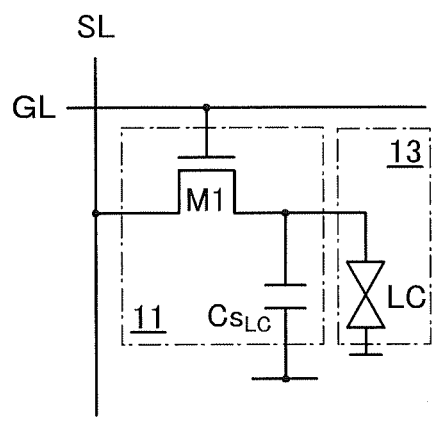
FIGS. 10A to 10C illustrate idling stop driving.

FIG. 10A is a circuit diagram of a pixel including a liquid crystal element 13 and a pixel circuit 11. FIG. 10A illustrates a transistor M1 connected to a signal line SL and a gate line GL, a capacitor $Cs_{LC}$, and a liquid crystal element LC.

Figure 10B:
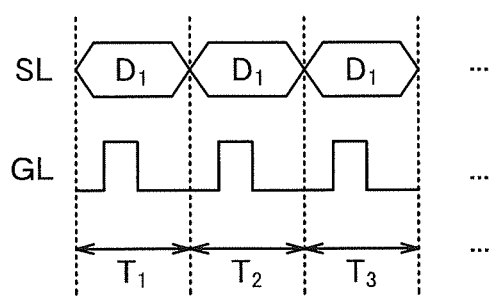

FIG. 10B is a timing chart illustrating waveforms of signals supplied to the signal line SL and the gate line GL in a normal driving mode in which the idling stop driving is not performed. In the normal driving mode, a normal frame frequency (e.g., 60 Hz) can be used for the operation.

Successive frame periods with the frame frequency are denoted by $T_1$, $T_2$, and $T_3$. In each of the frame periods, a scan signal is supplied to the gate line and data $D_1$ of the signal line is written to the pixel. This operation is performed regardless of whether the same data $D_1$ or different data is written in $T_1$ to $T_3$.

Figure 10C:
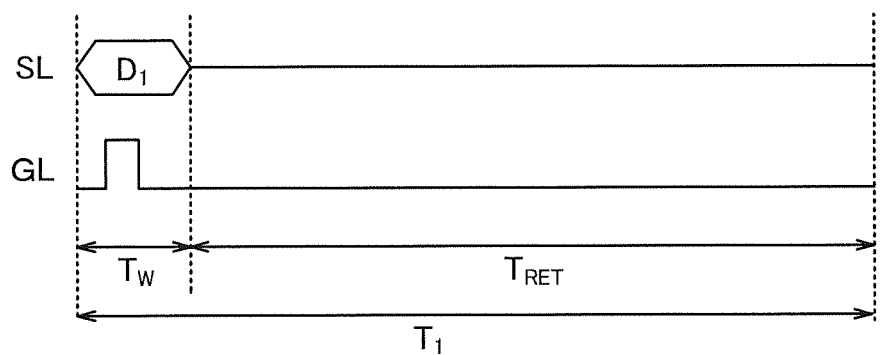

FIG. 10C is a timing chart illustrating waveforms of signals supplied to the signal line SL and the gate line GL in the idling stop driving. In the idling stop driving, a low frame frequency (e.g., 1 Hz) can be used for the operation.

FIG. 10C illustrates a frame period $T_1$ with the frame frequency, which includes a data writing period $T_W$ and a data retention period $T_{RET}$. The idling stop driving is performed as follows: in the period $T_W$, a scan signal is supplied to the gate line, and the data $D_1$ of the signal line is written to the pixel; in the period $T_{RET}$, the gate line is fixed to a low-level voltage to turn off the transistor M1, so that the written data $D_1$ is retained in the pixel.

Since having a low off-state current, the OS transistor used as the transistor M1 can retain the data $D_1$ for a long time. Although FIGS. 10A to 10C show the example in which the liquid crystal element LC is used, the idling stop driving is also available when a light-emitting element such as an organic EL element is used.

In the circuit diagram in FIG. 10A, the liquid crystal element LC might serve as a leakage path of the data $D_1$. Therefore, to perform proper idling stop driving, the resistivity of the liquid crystal element LC is preferably higher than or equal to $1.0 \times 10^{14}$ W·cm.

The camera 105 has a function of capturing an image in accordance with incident light.

The GPS receiver 106 can communicate with a communication satellite and has a function of calculating a receiving position.

The data input/output portion 107 has a function of obtaining/outputting image data or the like from/to the outside. For example, the data input/output portion 107 can be connected to a wired or wireless network and can obtain image data or the like from the outside through the network. Furthermore, the data input/output portion 107 may be connected to a storage medium that stores image data or the like.

The touch sensor 113 is an input unit and overlaps with the display portion 110. The touch sensor 113 has a function of converting a touch operation of a user on the display portion 110 into an electrical signal and outputting the signal to the data processing circuit 101. The input data is output to the data processing circuit 101 and is then used as an input signal for application software executed by the data processing circuit 101.

The photosensor 114 has a function of measuring the illuminance of an environment in which the display system 10 is used. With the obtained illuminance information, the data processing circuit 101 and the control circuit 104 can adjust the luminance of an image displayed by the pixel 46 and the luminance of an image displayed by the pixel 47. The luminance of a reflective liquid crystal element which can be used for the pixel 46 depends on the ambient illuminance. Therefore, the luminance of a light-emitting element which can be used for the pixel 47 is preferably changed in accordance with the ambient illuminance to be balanced with the luminance of the pixel 46. Note that the photosensor 114 may be provided in the pixel. The touch sensor 113 and the photosensor 114 can be omitted from the display system 10 of one embodiment of the present invention.

The display system 10 including the above-described components can display a composite image of a plurality of images. For example, an image of an object is captured by the camera 105, and information on the object or an image which is desired to be displayed in combination with the object is obtained from the data input/output portion 107; these can be combined with each other and displayed on the display portion 110.

When an image P captured by the camera 105 is displayed by one of the pixels 46 and 47 while an image Q obtained through the data input/output portion 107 is displayed by the other of the pixels 46 and 47, the displayed images P and Q partly overlap with each other. Thus, a region of the image P overlapping with the image Q is preferably processed into a black image. Such processing can be performed by the data processing circuit. Such processing is unnecessary depending on usage.

The position where the image Q is combined with the image P can be determined by a designated marker in the image P. Alternatively, the position can be determined from, for example, a result of calculation based on positional information obtained by the GPS receiver 106, information obtained through the data input/output portion 107 or imaging information of the camera 105, or combined information thereof.

The control circuit 104 has a function of making the pixel 46 display image data that is input from the first memory 102. The pixel 46 includes a reflective liquid crystal element and is capable of the above-described idling stop driving. Thus, when image data is displayed at a low rewriting frequency by the pixel 46, the operation of a peripheral circuit for driving the pixel 46 can be suspended for certain frame periods.

In addition, the control circuit 104 has a function of making the pixel 47 display image data that is input from the second memory 103. The pixel 47 includes a light-emitting element and has a favorable responsiveness in displaying a moving image. Thus, the pixel 47 preferably displays an image that requires a higher rewriting frequency than the image data displayed by the pixel 46.

The number of frames for the idling stop driving may be a predetermined number or may be changed automatically in accordance with a change in environment sensed by a variety of sensors (having a function of measuring force, displacement, position, speed, acceleration, angular velocity, rotation number, distance, light, magnetism, temperature, a chemical substance, sound, time, hardness, an electric field, current, voltage, electric power, radiation, flow rate, humidity, gradient, oscillation, odor, infrared ray, or the like). Such control can improve the consistency with reality and reduce unnecessary rewriting of image data to lower power consumption.

A semiconductor layer of a semiconductor device such as a transistor used for the above pixel or a circuit for driving the pixel preferably includes a metal oxide. As the metal oxide, for example, a cloud-aligned composite oxide semiconductor (CAC-OS) described later can be used.

In particular, an oxide semiconductor having a wider bandgap than silicon is preferably used. When a semiconductor material having a wider bandgap and a lower carrier density than silicon is used, the off-state current of a transistor can be reduced.

Charge accumulated in a capacitor through the transistor can be retained for a long time because of its low off-state current. When such a transistor is used for the pixel, the operation of a driver circuit can be suspended while the gray scale of an image displayed in each display region is maintained. As a result, an electronic device with extremely low power consumption can be obtained.

A semiconductor device such as a transistor used for the above pixel or a circuit for driving the pixel may include a polycrystalline semiconductor. For example, polycrystalline silicon is preferably used. Polycrystalline silicon can be formed at a lower temperature than single-crystal silicon and has a higher field effect mobility and a higher reliability than amorphous silicon. When such a polycrystalline semiconductor is used for the pixel, the aperture ratio of the pixel can be improved. Even in the case where a very large number of pixels are provided, a gate driver circuit and a source driver circuit can be formed over the same substrate as the pixels, so that the number of components of an electronic device can be reduced.

At least part of this embodiment can be implemented in combination with any of the other embodiments described in this specification as appropriate.

Embodiment 2

In this embodiment, a display device that can be used for one embodiment of the present invention and a method for driving the display device will be described.

The display device of one embodiment of the present invention can include a pixel provided with a first display element that reflects visible light, a pixel provided with a second display element that emits visible light, a pixel provided with a third display element that transmits visible light, or a pixel provided with the first display element and the second display element or the third display element.

In this embodiment, a display device including the first display element that reflects visible light and the second display element that emits visible light will be described.

The display device has a function of displaying an image by utilizing first light reflected from the first display element and/or second light emitted from the second display element. Alternatively, the display device has a function of expressing gray scales by individually controlling the amount of the first light reflected from the first display element and the amount of the second light emitted from the second display element.

The display device preferably includes a first pixel that expresses gray scales by controlling the amount of light reflected from the first display element and a second pixel that expresses gray scales by controlling the amount of light emitted from the second display element. For example, the first pixels and the second pixels are arranged in a matrix to form a display portion.

It is preferable that the first pixels and the second pixels be the same in number and be arranged with the same pitch in a display region. Here, the adjacent first and second pixels can be collectively referred to as a pixel unit. Accordingly, as described later, an image displayed by only a plurality of first pixels, an image displayed by only a plurality of second pixels, and an image displayed by both the plurality of first pixels and the plurality of second pixels can be displayed in the same display region.

As the first display element included in the first pixel, an element that performs display by reflecting external light can be used. Such an element does not include a light source, and thus, the power consumption for display can be significantly reduced.

As the first display element, typically, a reflective liquid crystal element can be used. Alternatively, as the first display element, a microelectromechanical systems (MEMS) shutter element, an optical interference type MEMS element, an element to which a microcapsule method, an electrophoretic method, an electrowetting method, an Electronic Liquid Powder (registered trademark) method, or the like is applied, or the like can be used.

As the second display element included in the second pixel, an element that performs display by utilizing light from its own light source can be used. Specifically, it is preferable to use an electroluminescent element in which light emission can be extracted from a light-emitting substance by application of an electric field. Since the luminance and chromaticity of light emitted from such a pixel are not affected by external light, an image with high color reproducibility (a wide color gamut) and high contrast, i.e. a clear image, can be displayed.

As the second display element, for example, a self-luminous light-emitting element such as an organic light-emitting diode (OLED), a light-emitting diode (LED), a quantum-dot light-emitting diode (QLED), or a semiconductor laser can be used. Alternatively, a combination of a backlight that serves as a light source and a transmissive liquid crystal element that controls the amount of light from the backlight transmitted therethrough may be used as the display element included in the second pixel.

The first pixel can include, for example, a subpixel exhibiting white (W) or subpixels exhibiting light of three colors of red (R), green (G), and blue (B). Similarly, the second pixel can include, for example, a subpixel exhibiting white (W) or subpixels exhibiting light of three colors of red (R), green (G), and blue (B). Note that the first pixel and the second pixel may each include subpixels of four or more colors. As the number of kinds of subpixels is increased, the power consumption can be reduced and the color reproducibility can be improved.

In one embodiment of the present invention, the display mode can be switched between a first mode in which an image is displayed by the first pixels, a second mode in which an image is displayed by the second pixels, and a third mode in which an image is displayed by the first pixels and the second pixels. As described in Embodiment 1, it is also possible to input different image signals to the first pixels and the second pixels to display a composite image.

In the first mode, an image is displayed using light reflected from the first display element. The first mode, which requires no light source, is a driving mode with extremely low power consumption. For example, the first mode is effective in the case where external light is white or near-white light with sufficiently high illuminance. The first mode is a display mode suitable for displaying text information of a book, a document or the like. The use of reflected light enables eye-friendly display, thereby mitigating eye strain.

In the second mode, an image is displayed utilizing light emitted from the second display element. Thus, an extremely clear image (with high contrast and high color reproducibility) can be displayed regardless of the illuminance and chromaticity of external light. For example, the second mode is effective when the illuminance of external light is extremely low, e.g., during the night or in a dark room. When a bright image is displayed under weak external light, a user may feel that the image is too bright. To prevent this, an image with reduced luminance is preferably displayed in the second mode. Thus, excessive brightness can be suppressed, and the power consumption can be reduced. The second mode is suitable for displaying a clear image, a smooth moving image, or the like.

In the third mode, display is performed utilizing both light reflected from the first display element and light emitted from the second display element. Specifically, in this driving mode, light from the first pixel and light from the second pixel adjacent to the first pixel are mixed to express one color. An image can be displayed more clearly than in the first mode, and the power consumption can be lower than that in the second mode. For example, the third mode is effective when the illuminance of external light is relatively low, e.g., under indoor illumination or in the morning or evening, or when the external light does not represent a white chromaticity. Furthermore, the mixed light of reflected light and emitted light makes it possible to display an image that gives a viewer an impression as if he or she saw a painting.

A more specific example of one embodiment of the present invention will be described below with reference to drawings.

[Structure Example of Display Device]

Figure 11:
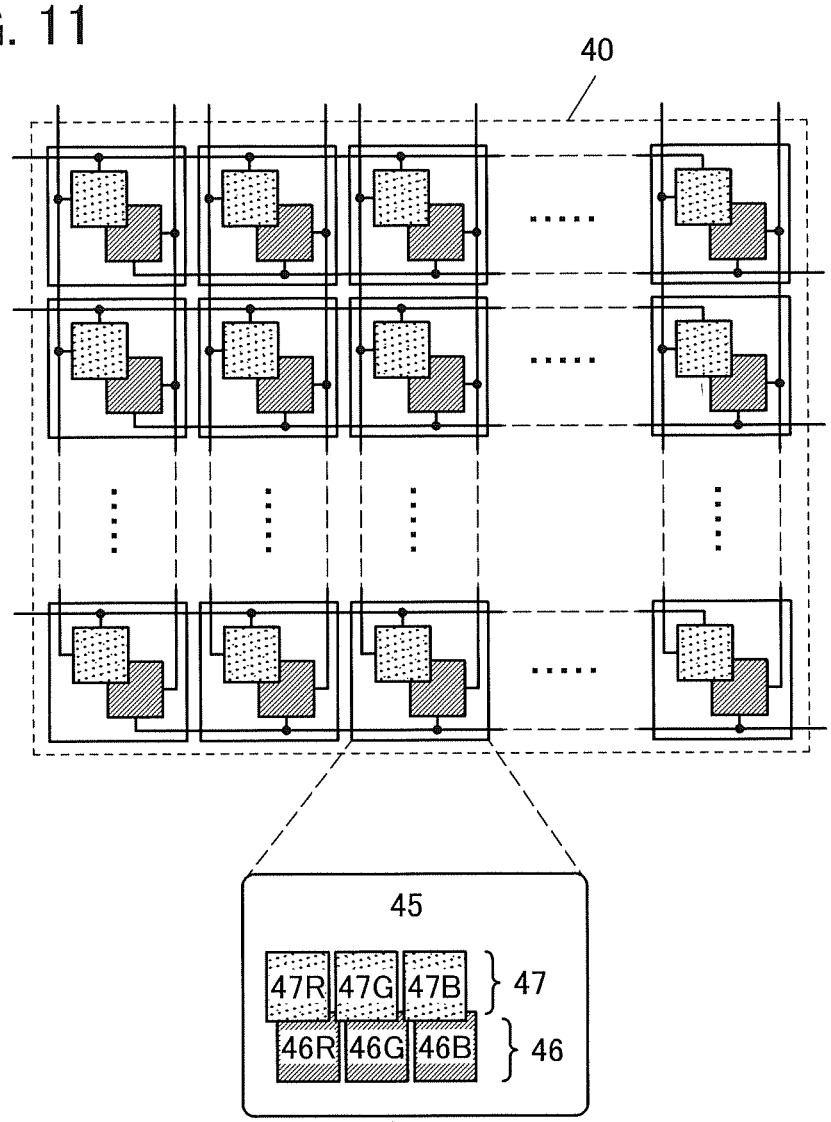
FIG. 11 illustrates a pixel unit.

FIG. 11 illustrates the pixel array 40 included in the display device of one embodiment of the present invention. The pixel array 40 includes the plurality of pixel units 45 arranged in a matrix. The pixel unit 45 includes the pixel 46 and the pixel 47.

FIG. 11 shows an example in which the pixel 46 and the pixel 47 each include display elements corresponding to three colors of red (R), green (G), and blue (B).

The pixel 46 includes a display element 46R corresponding to red (R), a display element 46G corresponding to green (G), and a display element 46B corresponding to blue (B). The display elements 46R, 46G, and 46B are each a first display element that utilizes light from a light source.

The pixel 47 includes a display element 47R corresponding to red (R), a display element 47G corresponding to green (G), and a display element 47B corresponding to blue (B). The display elements 47R, 47G, and 47B are each a second display element that utilizes reflection of external light.

The above is the description of the structure example of the display device.

[Structure Example of Pixel Unit]

Figure 12A:
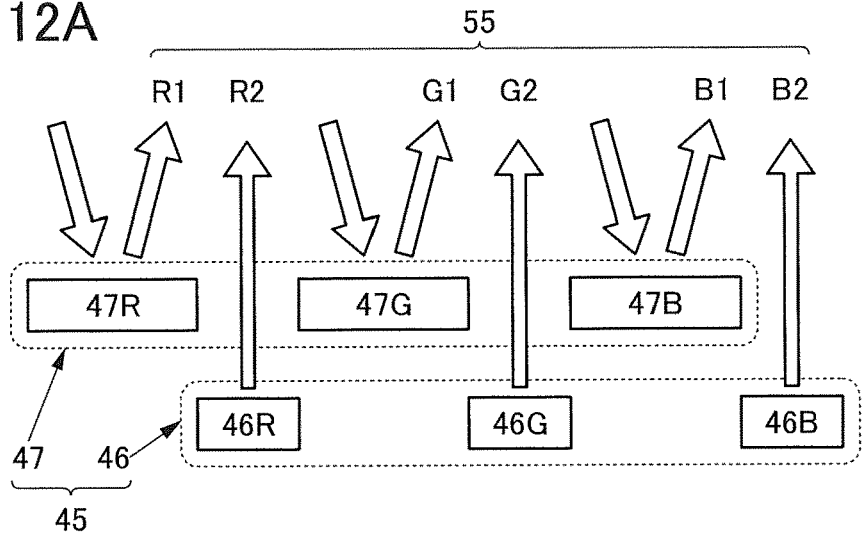
FIGS. 12A to 12C each illustrate a pixel unit.
Figure 12B:
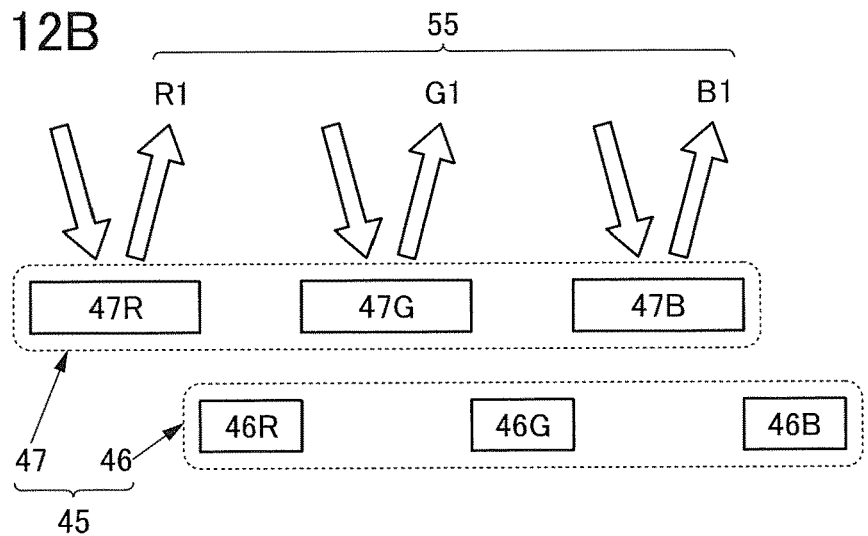
Figure 12C:
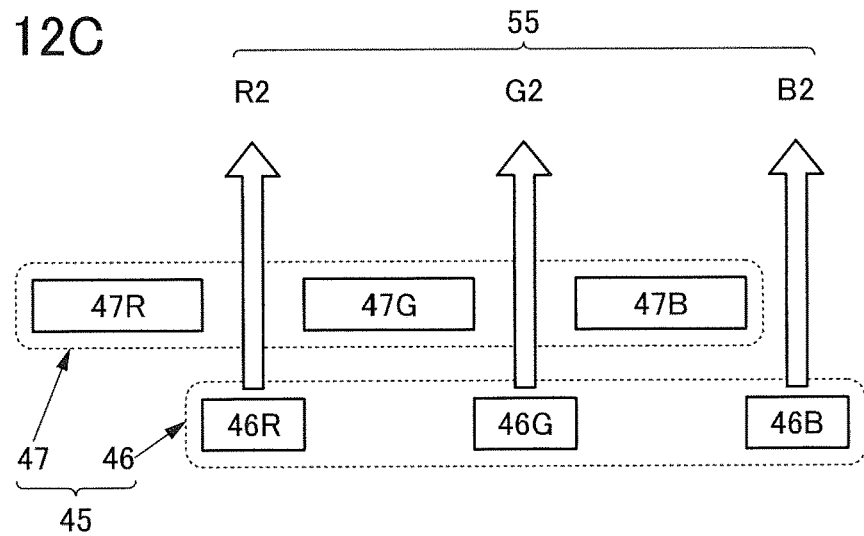

Next, the pixel unit 45 will be described with reference to FIGS. 12A to 12C. FIGS. 12A to 12C are schematic views illustrating structure examples of the pixel unit 45.

The pixel 46 includes the display element 46R, the display element 46G, and the display element 46B. The display element 46R includes a light source and emits, to the display surface side, red light R2 with a luminance corresponding to the gray level of red included in a second gray level input to the pixel 46. Similarly, the display element 46G and the display element 46B emit green light G2 and blue light B2, respectively, to the display surface side.

The pixel 47 includes the display element 47R, the display element 47G, and the display element 47B. The display element 47R reflects external light, which is then extracted to the display surface side as red light R1 with a luminance corresponding to the gray level of red included in a first gray level input to the pixel 47. Similarly, green light G1 and blue light B1 are extracted from the display element 47G and the display element 47B, respectively, to the display surface side.

[Third Mode]

FIG. 12A shows an example of an operation mode in which an image is displayed by driving both the display elements 47R, 47G, and 47B, which reflect external light, and the display elements 46R, 46G, and 46B, which emit light. As illustrated in FIG. 12A, the six colors of the light, i.e., the light R1, the light G1, the light B1, the light R2, the light G2, and the light B2 are mixed, whereby light 55 of a predetermined color can be extracted from the pixel unit 45 to the display surface side.

At this time, the luminance of each of the display elements 46R, 46G, and 46B is preferably low. For example, when the maximum value of the luminance of light that can be emitted from each of the display elements 46R, 46G, and 46B (also referred to as highest luminance) is 100%, the maximum value of the luminance of light emitted from each of the display elements 46R, 46G, and 46B in the third mode is preferably greater than or equal to 5% and less than or equal to 50%, further preferably greater than or equal to 1% and less than or equal to 60% of the highest luminance. Accordingly, an image can be displayed with low power consumption, the displayed image can become more like a painting, and eye-friendly display can be performed.

[First Mode]

FIG. 12B shows an example of an operation mode in which an image is displayed by driving the display elements 47R, 47G, and 47B, which reflect external light. As illustrated in FIG. 12B, for example, in the case where the illuminance of external light is sufficiently high, the pixel 46 is not driven and only the colors of the light (the light R1, the light G1, and the light B1) from the pixel 47 are mixed, whereby the light 55 of a predetermined color can be extracted from the pixel unit 45 to the display surface side. Thus, driving with extremely low power consumption can be performed.

[Second Mode]

FIG. 12C shows an example of an operation mode in which an image is displayed by driving the display elements 46R, 46G, and 46B. As illustrated in FIG. 12C, for example, in the case where the illuminance of external light is extremely low, the pixel 47 is not driven and only the colors of the light (the light R2, the light G2, and the light B2) from the pixel 46 are mixed, whereby the light 55 of a predetermined color can be extracted from the pixel unit 45 to the display surface side. Thus, a clear image can be displayed. Furthermore, the luminance is reduced when the illuminance of external light is low, which can prevent glare for the user and reduce power consumption.

In this mode, the luminance of the display elements that emit visible light is preferably higher than that in the third mode. For example, the maximum value of the luminance of light emitted from each of the display elements 46R, 46G, and 46B in the second mode can be 100% of the highest luminance, or greater than or equal to 50% and less than or equal to 100%, preferably greater than or equal to 60% and less than or equal to 100% of the highest luminance. Accordingly, a clear image can be displayed even in a place with bright external light.

Here, the maximum value of the luminance of light emitted from each of the display elements 46R, 46G, and 46B can be regarded as a dynamic range. That is, the dynamic range of each of the display elements 46R, 46G, and 46B in the third mode can be set to be narrower than that in the second mode. For example, the dynamic range of the display element 46R, the display element 46G, or the display element 46B in the third mode can be set to greater than or equal to 5% and less than or equal to 50%, preferably greater than or equal to 1% and less than or equal to 60% of the dynamic range in the second mode.

The above is the description of the structure example of the pixel unit 45.

At least part of this embodiment can be implemented in combination with any of the other embodiments described in this specification as appropriate.

Embodiment 3

An example of a display panel which can be used for the display device of one embodiment of the present invention will be described below. The display panel described below as an example includes both a reflective liquid crystal element and a light-emitting element and can perform display both in a transmissive mode and in a reflective mode.

Configuration Example

FIG. 13A is a block diagram showing a configuration example of a display device 400. The display device 400 includes a plurality of pixels 410 arranged in a matrix in a display portion 362. Furthermore, the display device 400 includes a circuit GD and a circuit SD. Furthermore, the display device 400 includes a plurality of wirings G1, a plurality of wirings G2, a plurality of wirings ANO, and a plurality of wirings CSCOM which are electrically connected to the circuit GD and the plurality of pixels 410 arranged in the direction R. Furthermore, the display device 400 includes a plurality of wirings S1 and a plurality of wirings S2 which are electrically connected to the circuit SD and the plurality of pixels 410 arranged in the direction C.

Although one circuit GD and one circuit SD are provided here for simplicity, the circuit GD and the circuit SD for driving a liquid crystal element and the circuit GD and the circuit SD for driving a light-emitting element may be separately provided.

The pixel 410 includes a reflective liquid crystal element and a light-emitting element. In the pixel 410, the liquid crystal element and the light-emitting element partly overlap with each other.

FIG. 13B1 shows a configuration example of a conductive layer 311$b$ included in the pixel 410. The conductive layer 311$b$ functions as a reflective electrode of the liquid crystal element in the pixel 410. The conductive layer 311$b$ has an opening 451.

The dashed line in FIG. 13B1 denotes a light-emitting element 360 positioned in a region overlapping with the conductive layer 311$b$. The light-emitting element 360 overlaps with the opening 451 of the conductive layer 311$b$. Thus, light emitted from the light-emitting element 360 is extracted to the display surface side through the opening 451.

In FIG. 13B1, the pixels 410 adjacent in the direction R are pixels of different colors. As illustrated in FIG. 13B1, the openings 451 in two pixels adjacent in the direction R are preferably provided in different positions in the conductive layers 311$b$ so as not to be arranged in a line. This allows two adjacent light-emitting elements 360 to be apart from each other, thereby preventing light emitted from the light-emitting element 360 from entering a coloring layer included in the adjacent pixel 410 (such a phenomenon is also referred to as crosstalk). Furthermore, since two adjacent light-emitting elements 360 can be arranged apart from each other, a high-resolution display device can be obtained even when EL layers of the light-emitting elements 360 are separately formed with a shadow mask or the like.

Alternatively, the arrangement illustrated in FIG. 13B2 may be employed.

If the ratio of the total area of the opening 451 to the total area excluding the opening is too large, display performed using the liquid crystal element is dark. If the ratio of the total area of the opening 451 to the total area excluding the opening is too small, display performed using the light-emitting element 360 is dark.

If the area of the opening 451 of the conductive layer 311b functioning as a reflective electrode is too small, the extraction efficiency of light emitted from the light-emitting element 360 is decreased.

The opening 451 may have a polygonal shape, a quadrangular shape, an elliptical shape, a circular shape, a cross shape, a stripe shape, a slit shape, or a checkered pattern, for example. The opening 451 may be provided close to the adjacent pixel. The opening 451 is preferably provided close to another pixel displaying the same color, in which case crosstalk can be suppressed.

[Circuit Configuration Example]

Figure 14:
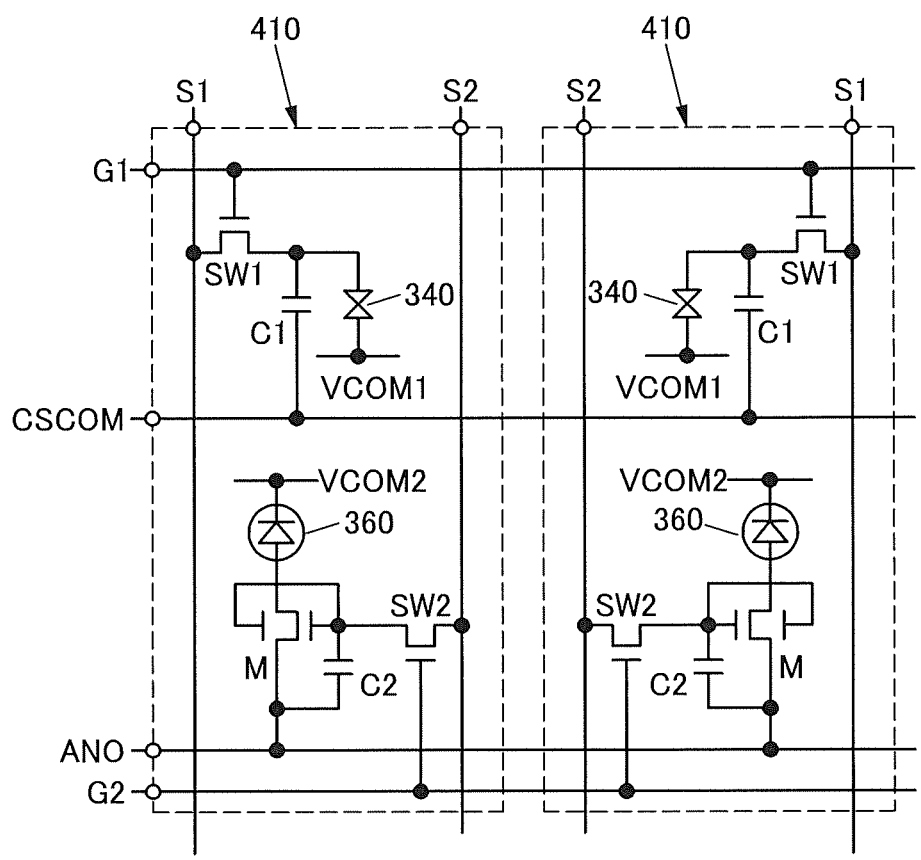
FIG. 14 illustrates a circuit of a display device.

FIG. 14 is a circuit diagram showing a configuration example of the pixel 410. FIG. 14 illustrates two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 14 also illustrates a wiring VCOM1 which is electrically connected to the liquid crystal element 340 and a wiring VCOM2 which is electrically connected to the light-emitting element 360.

FIG. 14 shows an example in which transistors are used as the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 14 shows an example in which the transistor M includes two gates connected to each other with a semiconductor positioned therebetween. This structure can increase current that can flow through the transistor M.

The wiring G1 can be supplied with a signal for controlling the on/off state of the switch SW1. A predetermined potential can be supplied to the wiring VCOM1. The wiring S1 can be supplied with a signal for controlling the alignment state of liquid crystal included in the liquid crystal element 340. A predetermined potential can be supplied to the wiring CSCOM.

The wiring G2 can be supplied with a signal for controlling the on/off state of the switch SW2. The wiring VCOM2 and the wiring ANO can be supplied with potentials having a difference large enough to make the light-emitting element 360 emit light. The wiring S2 can be supplied with a signal for controlling the conduction state of the transistor M.

In the reflective mode, for example, display can be performed by driving the pixel 410 in FIG. 14 with the signals supplied to the wiring G1 and the wiring S1 and utilizing the optical modulation of the liquid crystal element 340. In the transmissive mode, display can be performed by driving the pixel with the signals supplied to the wiring G2 and the wiring S2 to make the light-emitting element 360 emit light. In the case where both driving modes are combined, the pixel can be driven with the signals supplied to the wiring G1, the wiring G2, the wiring S1, and the wiring S2.

Figure 15A:
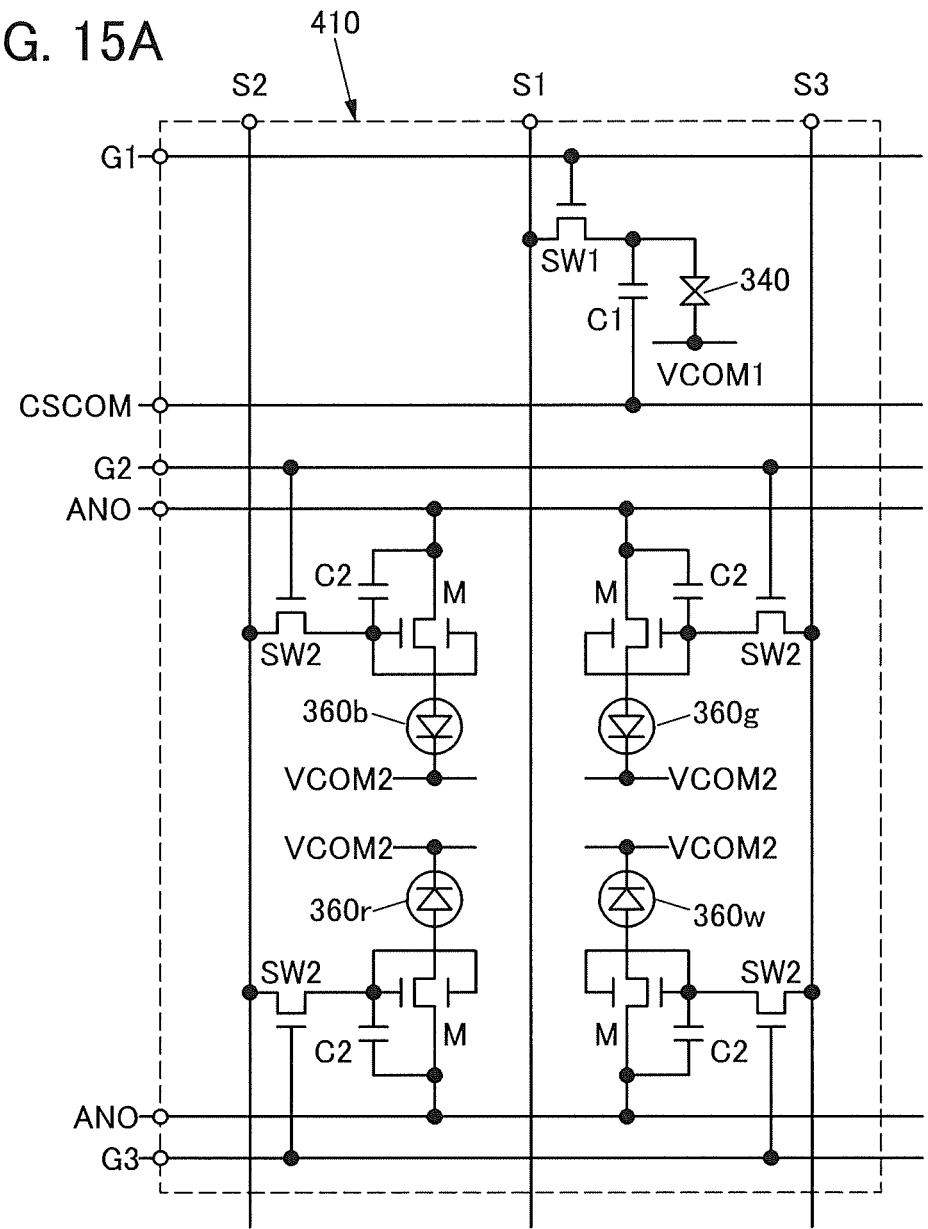
FIG. 15A illustrates a circuit of a display device.

Note that one embodiment of the present invention is not limited to the example shown in FIG. 14, in which one pixel 410 includes one liquid crystal element 340 and one light-emitting element 360. FIG. 15A shows an example in which one pixel 410 includes one liquid crystal element 340 and four light-emitting elements 360 (light-emitting elements 360r, 360g, 360b, and 360w).

In FIG. 15A, in addition to the wirings in FIG. 14, a wiring G3 and a wiring S3 are connected to the pixel 410.

In the example shown in FIG. 15A, for example, light-emitting elements which exhibit red (R), green (G), blue (B), and white (W) can be used as the four light-emitting elements 360. A reflective liquid crystal element which exhibits white can be used as the liquid crystal element 340. This enables white display with high reflectivity in the reflective mode. This also enables low-power display with excellent color-rendering properties in the transmissive mode.

Figure 15B:
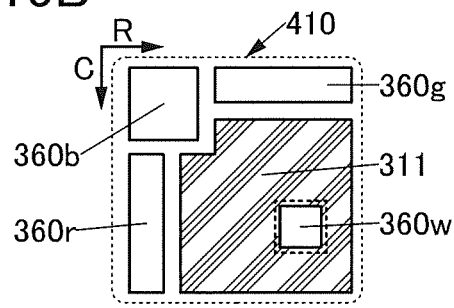
FIG. 15B is a top view of a pixel.

FIG. 15B shows a configuration example of the pixel 410. The pixel 410 includes the light-emitting element 360w which overlaps with an opening of an electrode 311 and the light-emitting elements 360r, 360g, and 360b which are located in the periphery of the electrode 311. It is preferable that the light-emitting elements 360r, 360g, and 360b have substantially the same light-emitting area.

[Structure Example of Display Panel]

Figure 16:
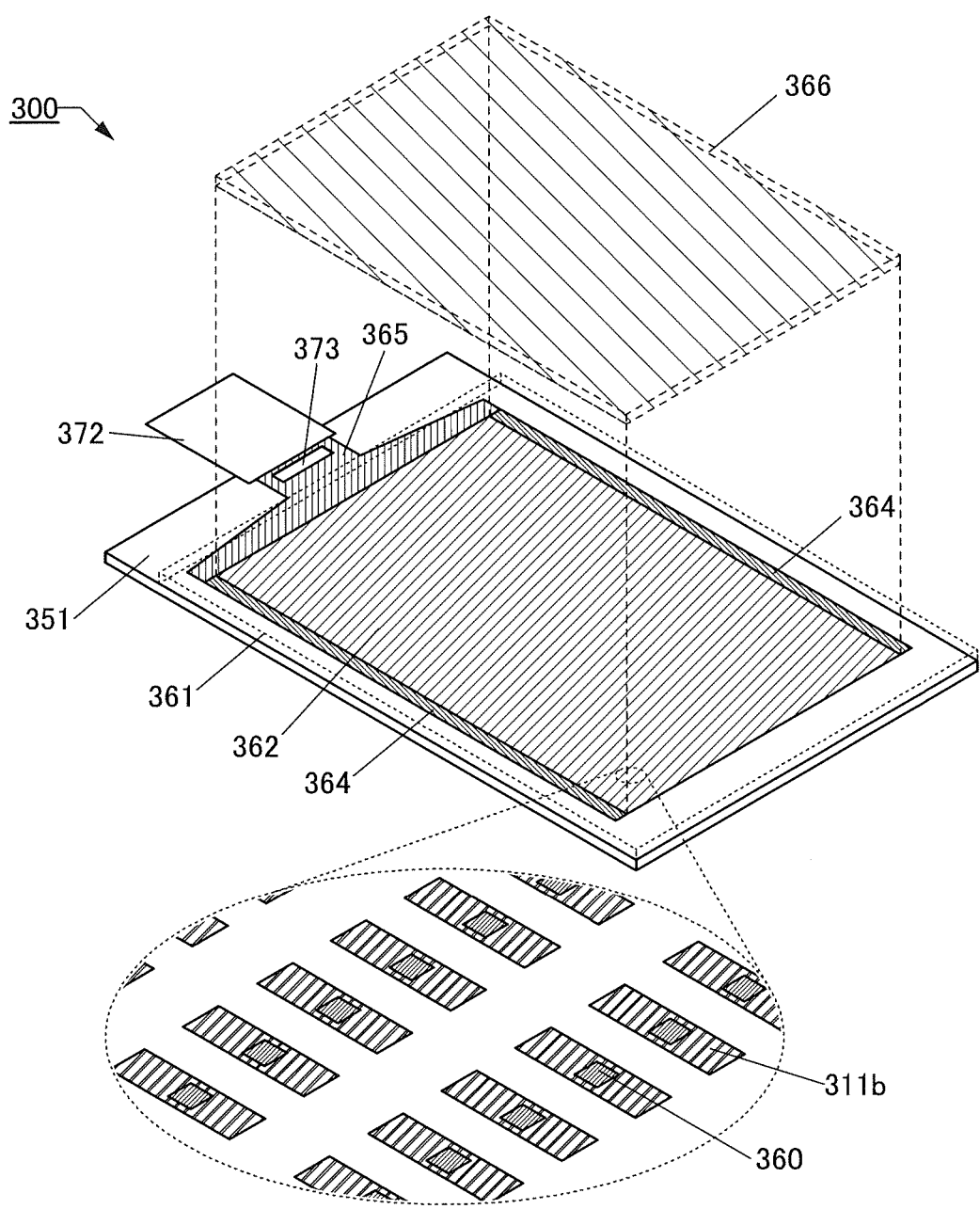
FIG. 16 illustrates a structure of a display device.

FIG. 16 is a schematic perspective view of a display panel 300 of one embodiment of the present invention. In the display panel 300, a substrate 351 and a substrate 361 are attached to each other. In FIG. 16, the substrate 361 is denoted by a dashed line.

The display panel 300 includes a display portion 362, a circuit 364, a wiring 365, and the like. For example, the substrate 351 is provided with the circuit 364, the wiring 365, and the conductive layer 311b that functions as a pixel electrode. FIG. 16 shows an example in which an IC 373 and an FPC 372 are mounted on the substrate 351. Thus, the structure illustrated in FIG. 16 can be referred to as a display module including the display panel 300, the FPC 372, and the IC 373.

As the circuit 364, for example, a circuit functioning as a scan line driver circuit can be used.

The wiring 365 has a function of supplying signals and power to the display portion 362 and the circuit 364. The signals and the power are input to the wiring 365 from the outside through the FPC 372 or from the IC 373.

FIG. 16 shows an example in which the IC 373 is provided over the substrate 351 by a chip on glass (COG) method or the like. As the IC 373, for example, an IC functioning as a scan line driver circuit or a signal line driver circuit can be used. Note that the IC 373 may be omitted, for example, when the display panel 300 includes circuits functioning as a scan line driver circuit and a signal line driver circuit or when circuits functioning as a scan line driver circuit and a signal line driver circuit are externally provided and signals for driving the display panel 300 are input through the FPC 372. Alternatively, the IC 373 may be mounted on the FPC 372 by a chip on film (COF) method or the like.

FIG. 16 shows an enlarged view of part of the display portion 362. The conductive layers 311b included in a plurality of display elements are arranged in a matrix in the display portion 362. The conductive layer 311b has a function of reflecting visible light and serves as a reflective electrode of the liquid crystal element 340 described later.

As illustrated in FIG. 16, the conductive layer 311b has an opening. The light-emitting element 360 is positioned closer to the substrate 351 than the conductive layer 311b. Light is emitted from the light-emitting element 360 to the substrate 361 side through the opening of the conductive layer 311b.

Furthermore, a touch sensor can be provided over the substrate 361. For example, a sheet-like capacitive touch sensor 366 may be provided so as to overlap with the display portion 362. Alternatively, the touch sensor may be provided between the substrate 361 and the substrate 351. In the case where the touch sensor is provided between the substrate 361 and the substrate 351, an optical touch sensor including a photoelectric conversion element as well as a capacitive touch sensor may be used.

[Example 1 of Cross-Sectional Structure]

Figure 17:
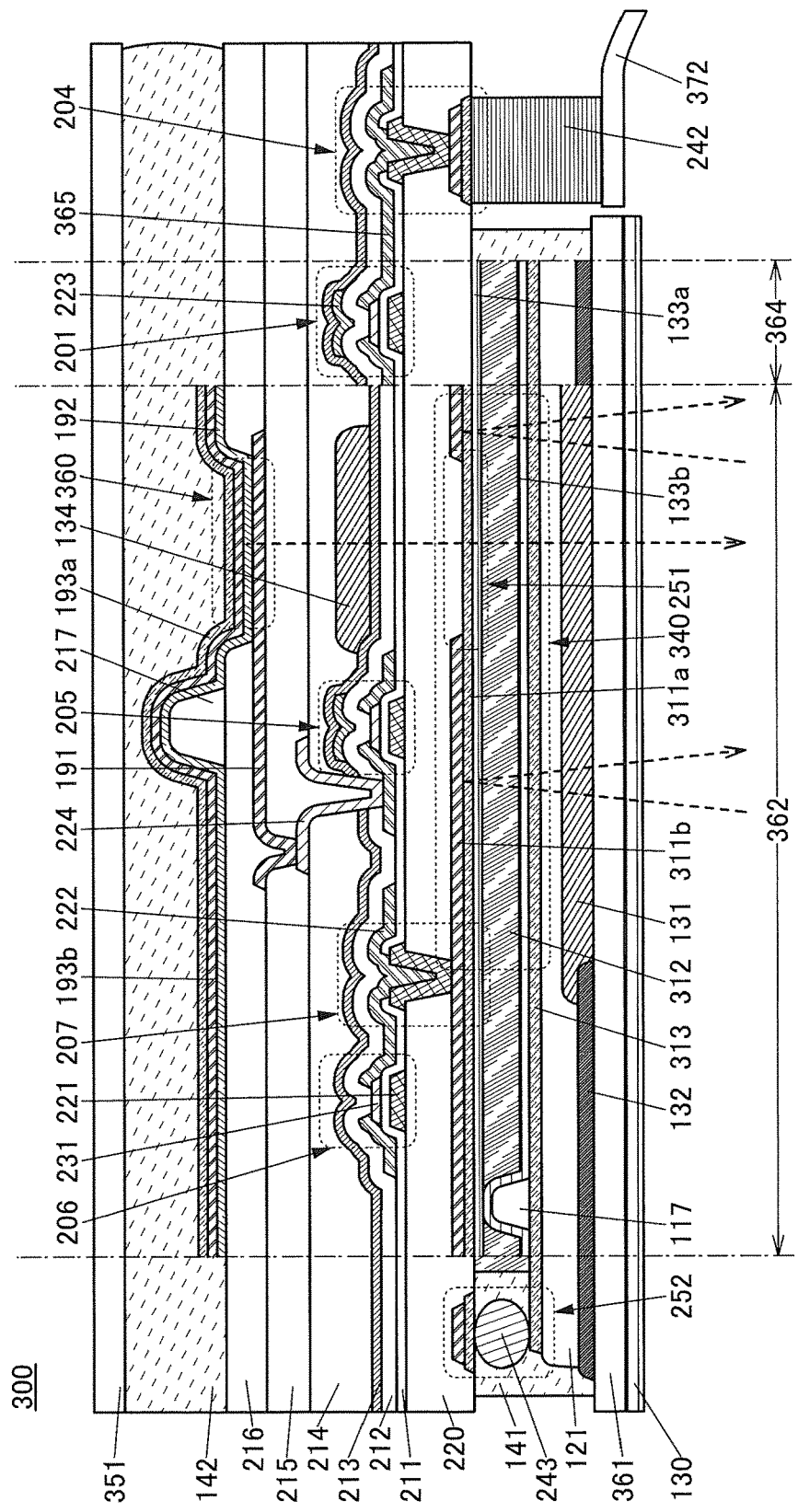
FIG. 17 illustrates a structure of a display device.

FIG. 17 shows examples of cross sections of part of a region including the FPC 372, part of a region including the circuit 364, and part of a region including the display portion 362 of the display panel illustrated as an example in FIG. 16. Note that the touch sensor 366 is not illustrated.

The display panel includes an insulating layer 220 between the substrate 351 and the substrate 361. The light-emitting element 360, a transistor 201, a transistor 205, a transistor 206, a coloring layer 134, and the like are provided between the substrate 351 and the insulating layer 220. The liquid crystal element 340, a coloring layer 131, and the like are provided between the insulating layer 220 and the substrate 361. The substrate 361 and the insulating layer 220 are attached to each other with an adhesive layer 141. The substrate 351 and the insulating layer 220 are attached to each other with an adhesive layer 142.

The transistor 206 is electrically connected to the liquid crystal element 340, and the transistor 205 is electrically connected to the light-emitting element 360. The transistor 205 and the transistor 206, which are both formed on a surface of the insulating layer 220 on the substrate 351 side, can be formed through the same process.

The substrate 361 is provided with the coloring layer 131, a light-blocking layer 132, an insulating layer 121, a conductive layer 313 functioning as a common electrode of the liquid crystal element 340, an alignment film 133b, an insulating layer 117, and the like. The insulating layer 117 functions as a spacer for holding a cell gap of the liquid crystal element 340.

Insulating layers such as an insulating layer 211, an insulating layer 212, an insulating layer 213, an insulating layer 214, and an insulating layer 215 are provided on the substrate 351 side of the insulating layer 220. Part of the insulating layer 211 functions as a gate insulating layer of each transistor. The insulating layer 212, the insulating layer 213, and the insulating layer 214 are provided to cover the transistors. The insulating layer 215 is provided to cover the insulating layer 214. The insulating layer 214 and the insulating layer 215 each function as a planarization layer. Note that here, the three insulating layers, the insulating layer 212, the insulating layer 213, and the insulating layer 214, are provided to cover the transistors and the like; however, the number of insulating layers is not limited to three and may be one, two, or four or more. The insulating layer 214 functioning as a planarization layer is not necessarily provided.

The transistor 201, the transistor 205, and the transistor 206 each include a conductive layer 221 part of which functions as a gate, conductive layers 222 part of which functions as a source and a drain, and a semiconductor layer 231. Here, a plurality of layers obtained by processing the same conductive film is shown with the same hatching pattern.

The liquid crystal element 340 is a reflective liquid crystal element. The liquid crystal element 340 has a structure in which a conductive layer 311a, liquid crystal 312, and the conductive layer 313 are stacked. The conductive layer 311b that reflects visible light is provided in contact with a surface of the conductive layer 311a on the substrate 351 side. The conductive layer 311b has an opening 251. The conductive layer 311a and the conductive layer 313 each contain a material that transmits visible light. In addition, an alignment film 133a is provided between the liquid crystal 312 and the conductive layer 311a, and the alignment film 133b is provided between the liquid crystal 312 and the conductive layer 313. A polarizing plate 130 is provided on an outer surface of the substrate 361.

In the liquid crystal element 340, the conductive layer 311b has a function of reflecting visible light, and the conductive layer 313 has a function of transmitting visible light. Light entering from the substrate 361 side is polarized by the polarizing plate 130, passes through the conductive layer 313 and the liquid crystal 312, and is reflected by the conductive layer 311b. Then, the light passes through the liquid crystal 312 and the conductive layer 313 again and reaches the polarizing plate 130. In this case, optical modulation of the light can be controlled by controlling the alignment of the liquid crystal with a voltage applied between the conductive layer 311b and the conductive layer 313. That is, the intensity of light extracted through the polarizing plate 130 can be controlled. Light other than that in a particular wavelength region is absorbed by the coloring layer 131, so that red light is extracted, for example.

The light-emitting element 360 is a bottom-emission light-emitting element. The light-emitting element 360 has a structure in which a conductive layer 191, an EL layer 192, and a conductive layer 193b are stacked in this order from the insulating layer 220 side. In addition, a conductive layer 193a is provided to cover the conductive layer 193b. The conductive layer 193b contains a material that reflects visible light, and the conductive layer 191 and the conductive layer 193a each contain a material that transmits visible light. Light is emitted from the light-emitting element 360 to the substrate 361 side through the coloring layer 134, the insulating layer 220, the opening 251, the conductive layer 313, and the like.

Here, as illustrated in FIG. 17, the opening 251 is preferably provided with the conductive layer 311a which transmits visible light. Accordingly, the liquid crystal 312 is aligned in a region overlapping with the opening 251 as well as in the other region; therefore, an alignment defect of the liquid crystal in a boundary portion between these regions, which might cause undesired light leakage, can be suppressed.

As the polarizing plate 130 provided on the outer surface of the substrate 361, a linear polarizing plate or a circularly polarizing plate can be used. An example of a circularly polarizing plate is a stack of a linear polarizing plate and a quarter-wave retardation plate. Such a structure can suppress reflection of external light. A light diffusion plate may be provided to suppress reflection of external light. The cell gap, alignment, drive voltage, and the like of the liquid crystal element used as the liquid crystal element 340 are adjusted in accordance with the kind of the polarizing plate so that desirable contrast is obtained.

An insulating layer 217 is provided over the insulating layer 216 which covers an end portion of the conductive layer 191. The insulating layer 217 functions as a spacer that prevents the substrate 351 from being unnecessarily close to the insulating layer 220. In addition, in the case where the EL layer 192 or the conductive layer 193a is formed using a shielding mask (metal mask), the insulating layer 217 may have a function of preventing the shielding mask from being in contact with a surface on which the EL layer 192 or the conductive layer 193a is to be formed. Note that the insulating layer 217 is not necessarily provided.

One of a source and a drain of the transistor 205 is electrically connected to the conductive layer 191 of the light-emitting element 360 through a conductive layer 224.

One of a source and a drain of the transistor 206 is electrically connected to the conductive layer 311b through a connection portion 207. The conductive layer 311b and the conductive layer 311a are in contact with and electrically connected to each other. In the connection portion 207, the conductive layers provided on both surfaces of the insulating layer 220 are connected to each other through an opening of the insulating layer 220.

A connection portion 204 is provided in a region in which the substrate 351 and the substrate 361 do not overlap with each other. The connection portion 204 is electrically connected to the FPC 372 through a connection layer 242. The connection portion 204 has a structure similar to that of the connection portion 207. On the top surface of the connection portion 204, a conductive layer obtained by processing the same conductive film as the conductive layer 311a is exposed. Thus, the connection portion 204 and the FPC 372 can be electrically connected to each other through the connection layer 242.

A connection portion 252 is provided in part of a region in which the adhesive layer 141 is provided. In the connection portion 252, a conductive layer obtained by processing the same conductive film as the conductive layer 311a is electrically connected to part of the conductive layer 313 through a connector 243. Accordingly, a signal or a potential input from the FPC 372 connected on the substrate 351 side can be supplied to the conductive layer 313 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 243, a material capable of elastic deformation or plastic deformation is preferably used. As illustrated in FIG. 17, the connector 243 which is a conductive particle has a vertically crushed shape in some cases. Accordingly, the contact area between the connector 243 and a conductive layer electrically connected to the connector 243 is increased, so that contact resistance can be reduced and problems such as disconnection can be suppressed.

The connector 243 is preferably provided so as to be covered with the adhesive layer 141. For example, the connector 243 may be dispersed in the adhesive layer 141 which is not cured yet.

FIG. 17 shows an example of the circuit 364 in which the transistor 201 is provided.

In FIG. 17, for example, the transistor 201 and the transistor 205 each have a structure in which the semiconductor layer 231 in which a channel is formed is provided between two gates. One of the gates is formed using the conductive layer 221, and the other gate is formed using a conductive layer 223 which overlaps with the semiconductor layer 231 with the insulating layer 212 positioned therebetween. Such a structure enables the control of the threshold voltage of the transistor. In this case, the two gates may be connected to each other and supplied with the same signal to operate the transistor. Such a transistor can have a higher field-effect mobility and a higher on-state current than other transistors. Consequently, a circuit capable of high-speed operation can be formed. Furthermore, the area occupied by a circuit portion can be reduced. The use of the transistor having a high on-state current can reduce signal delay in wirings and suppress display unevenness even when the number of wirings is increased owing to an increase in the size or resolution of the display panel.

Note that the transistor included in the circuit 364 and the transistor included in the display portion 362 may have the same structure. A plurality of transistors included in the circuit 364 may have the same structure or different structures. A plurality of transistors included in the display portion 362 may have the same structure or different structures.

A material inhibiting diffusion of impurities such as water and hydrogen is preferably used for at least one of the insulating layers 212 and 213 which cover the transistors. That is, the insulating layer 212 or the insulating layer 213 can function as a barrier film. Such a structure can effectively suppress diffusion of the impurities into the transistors from the outside, and thus, a highly reliable display panel can be provided.

The insulating layer 121 is provided on the substrate 361 side to cover the coloring layer 131 and the light-blocking layer 132. The insulating layer 121 may function as a planarization layer. The insulating layer 121 enables the conductive layer 313 to have a substantially flat surface, resulting in a uniform alignment state of the liquid crystal 312.

[Example 2 of Cross-Sectional Structure]

Figure 18:
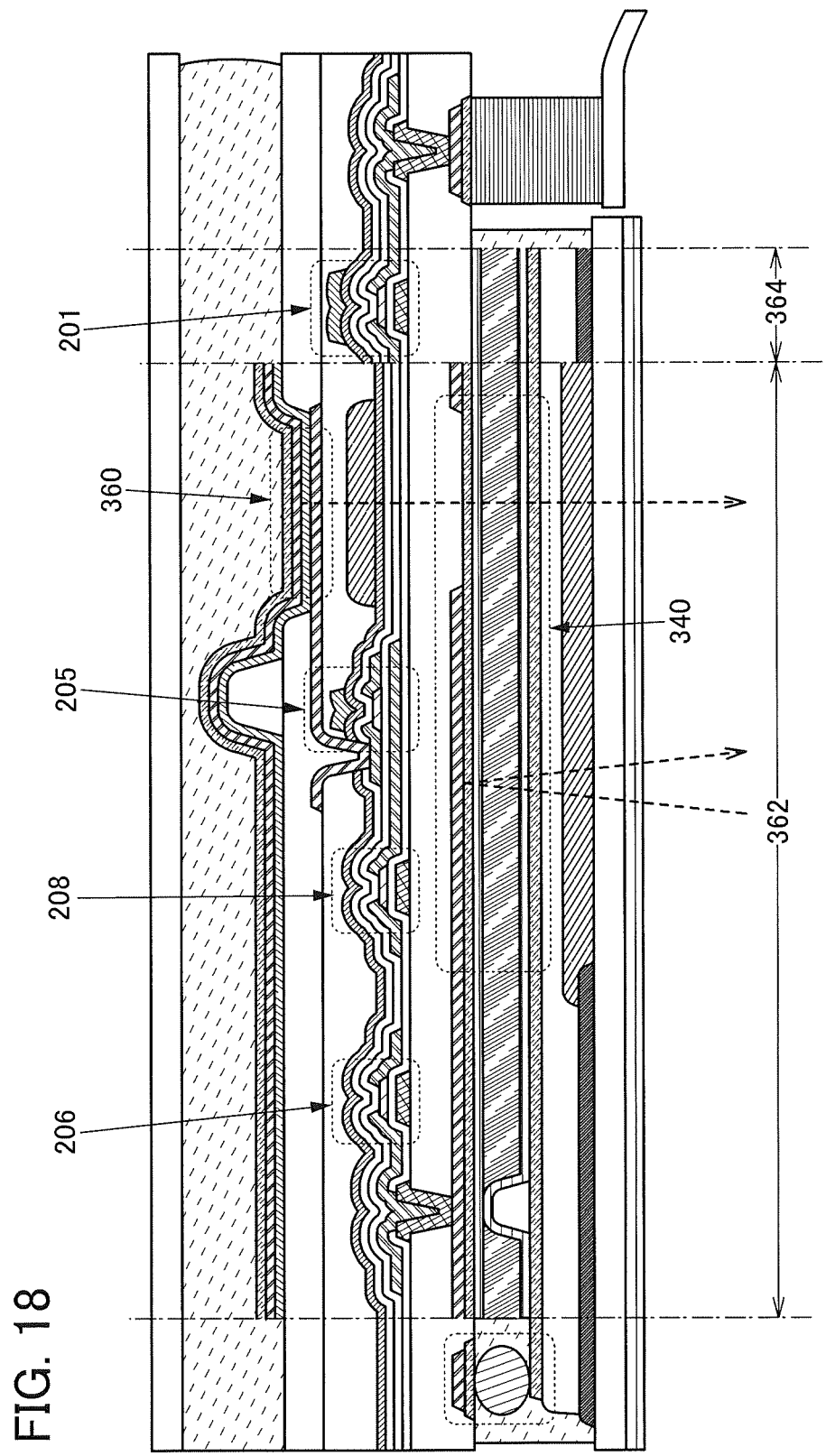
FIG. 18 illustrates a structure of a display device.

The display panel of one embodiment of the present invention may include a region in which a first transistor and a second transistor which are provided in a pixel overlap with each other as illustrated in FIG. 18. Such a structure enables a fabrication of a display panel having a reduced area per pixel and a pixel density that is high enough to display a high-resolution image.

For example, the display panel can include a region in which the transistor 205 for driving the light-emitting element 360 and a transistor 208 overlap with each other. Alternatively, the display panel may include a region in which the transistor 206 for driving the liquid crystal element 340 and one of the transistors 205 and 208 overlap with each other.

[Example 3 of Cross-Sectional Structure]

Figure 19:
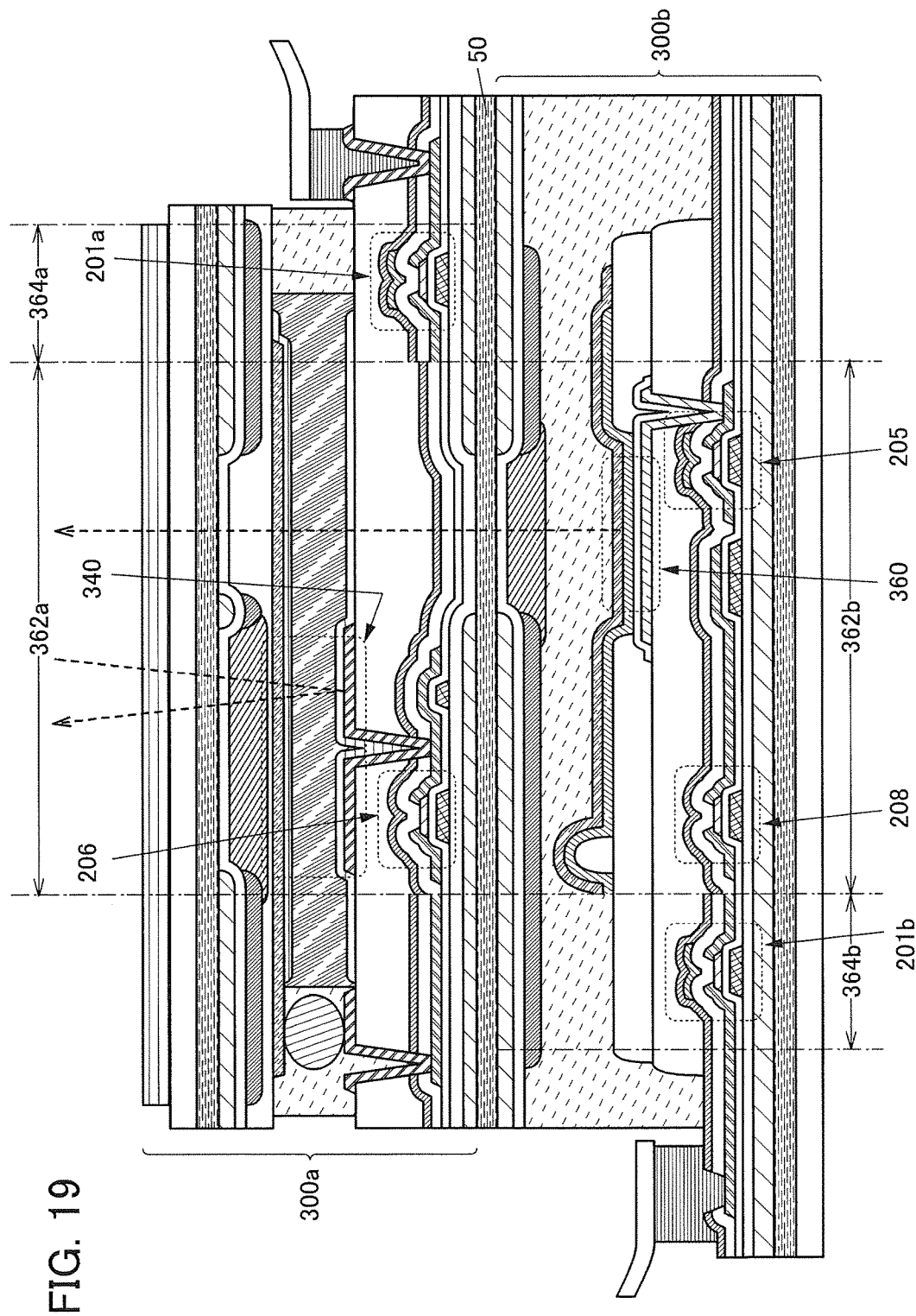
FIG. 19 illustrates a structure of a display device.

In the display panel of one embodiment of the present invention, a display panel 300a and a display panel 300b may be attached to each other with an adhesive layer 50 as illustrated in FIG. 19. The display panel 300*a* includes the liquid crystal element 340 and the transistor 206 in a display portion 362*a* and a transistor 201*a* in a circuit 364*a* for driving the display portion 362. The display panel 300*b* includes the light-emitting element 360 and the transistors 205 and 208 in a display portion 362*b* and a transistor 201*b* in a circuit 364*b* for driving the display portion 362*b*.

Such a structure enables the display panel 300*a* and the display panel 300*b* to be manufactured through their respective optimal processes, leading to improvement in manufacturing yield.

[Components]

The above-mentioned components will be described below.

[Substrate]

A material having a flat surface can be used as each of the substrates included in the display panel. The substrate through which light from the display element is extracted is formed using a material that transmits the light. For example, a material such as glass, quartz, ceramics, sapphire, or an organic resin can be used.

The weight and thickness of the display panel can be reduced using a thin substrate. Furthermore, a flexible display panel can be obtained using a substrate that is thin enough to have flexibility.

The substrate through which light emission is not extracted does not need to have a light-transmitting property; therefore, besides the above-mentioned substrates, a metal substrate or the like can be used. A metal substrate is preferable because its high thermal conductivity enables heat to be easily conducted to the whole substrate, thereby suppressing a local temperature rise in the display panel. To obtain flexibility or bendability, the thickness of the metal substrate is preferably greater than or equal to 10 μm and less than or equal to 200 μm, further preferably greater than or equal to 20 μm and less than or equal to 50 μm.

Although there is no particular limitation on the material of the metal substrate, for example, a metal such as aluminum, copper, or nickel or an alloy such as an aluminum alloy or stainless steel can be favorably used.

Alternatively, a substrate subjected to insulation treatment, such as a metal substrate whose surface is oxidized or provided with an insulating film, may be used. For example, an insulating film may be formed by a coating method such as a spin coating method or a dipping method, an electrodeposition method, an evaporation method, or a sputtering method. Alternatively, an oxide film may be formed on the surface of the substrate by leaving or heating the substrate in an oxygen atmosphere or by an anodic oxidation method or the like.

Examples of a material which has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a polyamide imide resin, a polyimide resin, or PET, whose thermal expansion coefficients are lower than or equal to $30\times10^{-6}$/K. A substrate in which a glass fiber is impregnated with an organic resin or a substrate whose thermal expansion coefficient is reduced by mixing an inorganic filler with an organic resin can also be used. A substrate using such a material is lightweight, and thus, a display panel using the substrate can also be lightweight.

In the case where the above material contains a fibrous body, a high-strength fiber of an organic compound or an inorganic compound is used as the fibrous body. The high-strength fiber specifically refers to a fiber with a high tensile elastic modulus or a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in the form of a woven or nonwoven fabric, and a structure body obtained by curing a resin with which such a fibrous body is impregnated may be used as a flexible substrate. The structure body including the fibrous body and the resin is preferably used as a flexible substrate, in which case the reliability against damage due to bending or local pressure can be improved.

Alternatively, glass, metal, or the like that is thin enough to have flexibility can be used for the substrate. Alternatively, a composite material in which glass and a resin material are attached to each other with an adhesive layer may be used.

A hard coat layer (e.g., a silicon nitride layer or an aluminum oxide layer) which protects a surface of the display panel from damage, a layer of a material that can disperse pressure (e.g., an aramid resin layer), or the like may be stacked over the flexible substrate. To suppress, for example, a decrease in the lifetime of the display element due to moisture or the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. In particular, when a glass layer is used, a barrier property against water and oxygen can be improved, and thus, a highly reliable display panel can be provided.

[Transistor]

A transistor includes a conductive layer functioning as a gate electrode, a semiconductor layer, a conductive layer functioning as a source electrode, a conductive layer functioning as a drain electrode, and an insulating layer functioning as a gate insulating layer. In the above example, a bottom-gate transistor is used.

Note that there is no particular limitation on the structure of the transistor included in the display device of one embodiment of the present invention. For example, a planar transistor, a staggered transistor, or an inverted staggered transistor may be used. Furthermore, a top-gate transistor or a bottom-gate transistor may be used. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used because deterioration of the transistor characteristics can be suppressed.

As a semiconductor material used for the transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later can be used.

A transistor including an oxide semiconductor which has a wider bandgap and a lower carrier density than silicon has a low off-state current; therefore, charge accumulated in a capacitor that is series-connected to the transistor can be retained for a long time.

As the semiconductor layer, for example, a film represented by an In-M-Zn-based oxide which contains indium, zinc, and M (a metal such as aluminum, titanium, gallium, germanium, yttrium, zirconium, lanthanum, cerium, tin, neodymium, or hafnium) can be used.

In the case where the oxide semiconductor included in the semiconductor layer is an In-M-Zn-based oxide, the atomic ratio of metal elements in a sputtering target used for depositing the In-M-Zn-based oxide preferably satisfies In≥M and Zn≥M. The atomic ratio of metal elements in such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio of metal elements in the deposited semiconductor layer may deviate from the above atomic ratio of metal elements in the sputtering target within a range of ±40%.

The bottom-gate transistor described as an example in this embodiment is preferable because the number of manufacturing steps can be reduced. When an oxide semiconductor, which can be formed at a lower temperature than polycrystalline silicon, is used for the semiconductor layer, even materials with low heat resistance can be used for a wiring, an electrode, or a substrate below the semiconductor layer, so that the range of choices of materials can be widened. For example, an extremely large glass substrate can be favorably used.

An oxide semiconductor film with a low carrier density is used as the semiconductor layer. For the semiconductor layer, for example, an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. Such an oxide semiconductor has a low impurity concentration and a low density of defect states and can thus be regarded as having stable characteristics.

Note that, without limitation to the above examples, a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor included in the semiconductor layer contains silicon or carbon, which are elements belonging to Group 14, the number of oxygen vacancies in the semiconductor layer is increased, so that an n-type layer is formed. Hence, the concentration of silicon or carbon (measured by secondary ion mass spectrometry) in the semiconductor layer is lower than or equal to $2 \times 10^{18}$ atoms/$cm^3$, preferably lower than or equal to $2 \times 10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer, which is measured by secondary ion mass spectrometry, is lower than or equal to $1 \times 10^{18}$ atoms/$cm^3$, preferably lower than or equal to $2 \times 10^{16}$ atoms/$cm^3$.

When the oxide semiconductor included in the semiconductor layer contains nitrogen, electrons serving as carriers are generated and the carrier density is increased, so that the semiconductor layer easily becomes n-type. Thus, a transistor which includes an oxide semiconductor containing nitrogen is likely to have normally-on characteristics. Hence, the nitrogen concentration in the semiconductor layer, which is measured by secondary ion mass spectrometry, is preferably lower than or equal to $5 \times 10^{18}$ atoms/$cm^3$.

The semiconductor layer may have a non-single-crystal structure, for example. The non-single-crystal structure includes a CAAC-OS (c-axis aligned crystalline oxide semiconductor or c-axis aligned a-b-plane-anchored crystalline oxide semiconductor) including a c-axis aligned crystal, a polycrystalline structure, a microcrystalline structure, or an amorphous structure, for example. Among the non-single-crystal structures, the amorphous structure has the highest density of defect states, whereas the CAAC-OS has the lowest density of defect states.

An oxide semiconductor film having an amorphous structure has, for example, disordered atomic arrangement and no crystalline component. In other words, an oxide film having an amorphous structure has, for example, a completely amorphous structure and no crystal part.

Note that the semiconductor layer may be a mixed film including two or more of the following regions: a region having an amorphous structure, a region having a microcrystalline structure, a region having a polycrystalline structure, a CAAC-OS region, and a region having a single-crystal structure. The mixed film has, for example, a single-layer structure or a stacked structure including two or more of the above-mentioned regions in some cases.

<Composition of CAC-OS>

Described below is the composition of a cloud aligned composite OS (CAC-OS) which can be used for a transistor disclosed in one embodiment of the present invention.

The CAC-OS is, for example, an oxide semiconductor material with a composition in which elements are unevenly distributed in regions each having a size of greater than or equal to 0.5 nm and less than or equal to 10 nm, preferably greater than or equal to 1 nm and less than or equal to 2 nm, or a similar size. In the following description of an oxide semiconductor, the state in which one or more metal elements are unevenly distributed in regions each having a size of greater than or equal to 0.5 nm and less than or equal to 10 nm, preferably greater than or equal to 1 nm and less than or equal to 2 nm, or a similar size and the regions including the metal element(s) are mixed is referred to as a mosaic pattern or a patch-like pattern.

Note that the oxide semiconductor preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

As an example of the CAC-OS, an In—Ga—Zn oxide with the CAC composition (such an In—Ga—Zn oxide may be particularly referred to as CAC-IGZO) will be described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. In this specification, for example, when the atomic ratio of In to an element M in a first region is larger than the atomic ratio of In to the element M in a second region, the first region has a higher In concentration than the second region.

Note that a compound containing In, Ga, Zn, and O is known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \le x0 \le 1$; m0 is a given number).

The above crystalline compound has a single-crystal structure, a polycrystalline structure, or a CAAC structure. Note that the CAAC structure is a crystal structure in which a plurality of IGZO nanocrystals has c-axis alignment and is connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a stacked structure of two or more films with different compositions. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In part of the composition of a CAC-OS which contains, instead of gallium, one or more metal elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like, nanoparticle regions including the metal element(s) as a main component(s) and nanoparticle regions including In as a main component are observed. These nanoparticle regions are randomly dispersed in a mosaic pattern.

The CAC-OS can be formed by a sputtering method under conditions where a substrate is not heated intentionally, for example. In the case of forming the CAC-OS by a sputtering method, one or more gases selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible; for example, the flow ratio of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, XRD shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, an energy dispersive X-ray spectroscopy (EDX) mapping image confirms that an In—Ga—Zn oxide with the CAC composition has a structure in which regions including $GaO_{X3}$ as a main component and regions including $In_{X2}Zn_{Y2}O_{Z2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed like clouds in the oxide semiconductor, a high field-effect mobility (μ) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the regions including $GaO_{X3}$ or the like as a main component are distributed in the oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility (μ) can be achieved.

A semiconductor element including a CAC-OS has a high reliability. Thus, the CAC-OS is suitably used for a variety of semiconductor devices typified by a display.

Alternatively, silicon may be used as a semiconductor in which a channel of the transistor is formed. Although amorphous silicon may be used as silicon, silicon having crystallinity is particularly preferable. For example, microcrystalline silicon, polycrystalline silicon, or single-crystal silicon is preferably used. In particular, polycrystalline silicon can be formed at a lower temperature than single-crystal silicon and has a higher field-effect mobility and a higher reliability than amorphous silicon.

The bottom-gate transistor described as an example in this embodiment is preferable because the number of manufacturing steps can be reduced. When amorphous silicon, which can be formed at a lower temperature than polycrystalline silicon, is used for the semiconductor layer, even materials with low heat resistance can be used for a wiring, an electrode, or a substrate below the semiconductor layer, so that the range of choices of materials can be widened. For example, an extremely large glass substrate can be favorably used. Meanwhile, a top-gate transistor is preferable because an impurity region is easily formed in a self-aligned manner and variation in characteristics or the like can be reduced. The top-gate transistor is particularly preferable when polycrystalline silicon, single-crystal silicon, or the like is employed.

[Conductive Layer]

As examples of materials that can be used for a gate, a source, and a drain of the transistor, and conductive layers such as a variety of wirings and electrodes included in the display device, metals such as aluminum, titanium, chromium, nickel, copper, yttrium, zirconium, molybdenum, silver, tantalum, and tungsten and alloys containing these metals as their main components can be given. A single-layer structure or a stacked structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because the shape controllability in etching is increased.

As a light-transmitting conductive material, a conductive oxide such as indium oxide, indium tin oxide, indium zinc oxide, zinc oxide, or zinc oxide to which gallium is added or graphene can be used. Alternatively, a metal material such as gold, silver, platinum, magnesium, nickel, tungsten, chromium, molybdenum, iron, cobalt, copper, palladium, or titanium or an alloy material containing the metal material can be used. Alternatively, a nitride of the metal material (e.g., titanium nitride) or the like may be used. In the case of using the metal material or the alloy material (or the nitride thereof), the thickness is set small enough to transmit light. Alternatively, a stacked film of any of the above materials can be used as the conductive layer. For example, a stacked film of indium tin oxide and an alloy of silver and magnesium is preferably used because the conductivity can be increased. These materials can also be used for conductive layers such as a variety of wirings and electrodes included in the display device and conductive layers (e.g., conductive layers functioning as a pixel electrode and a common electrode) included in the display element.

[Insulating Layer]

Examples of an insulating material that can be used for the insulating layers include resins such as an acrylic resin and an epoxy resin, a resin having a siloxane bond, and inorganic insulating materials such as silicon oxide, silicon oxynitride, silicon nitride oxide, silicon nitride, and aluminum oxide.

The light-emitting element is preferably provided between a pair of insulating films with low water permeability, in which case impurities such as water can be prevented from entering the light-emitting element. Thus, a decrease in device reliability can be suppressed.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like may be used.

For example, the water vapor transmission rate of the insulating film with low water permeability is lower than or equal to $1 \times 10^{-5}$ [g/m$^2$·day], preferably lower than or equal to $1 \times 10^{-6}$ [g/m$^2$·day], further preferably lower than or equal to $1 \times 10^{-7}$ [g/m$^2$·day], still further preferably lower than or equal to $1 \times 10^{-8}$ [g/m$^2$·day].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, the liquid crystal element can employ, besides the VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, or an antiferroelectric liquid crystal (AFLC) mode.

The liquid crystal element controls transmission or non-transmission of light by utilizing an optical modulation action of the liquid crystal. Note that the optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an antiferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used; an appropriate liquid crystal material may be used in accordance with the mode or design to be used.

In addition, to control the alignment of the liquid crystal, an alignment film can be provided. In the case where a horizontal electric field mode is employed, a liquid crystal exhibiting a blue phase for which an alignment film is unnecessary may be used. The blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition which includes a liquid crystal exhibiting a blue phase and a chiral material has a short response time and optical isotropy. In addition, the liquid crystal composition which includes a liquid crystal exhibiting a blue phase and a chiral material does not need alignment treatment and has a small viewing angle dependence. Since an alignment film need not be provided and rubbing treatment is unnecessary, electrostatic discharge damage caused by the rubbing treatment can be prevented and defects and damage of the liquid crystal display device in the manufacturing process can be reduced.

As the liquid crystal element, a transmissive liquid crystal element, a reflective liquid crystal element, a semi-transmissive liquid crystal element, or the like can be used.

In one embodiment of the present invention, in particular, a reflective liquid crystal element can be used.

In the case where a transmissive or semi-transmissive liquid crystal element is used, two polarizing plates are provided so that a pair of substrates is positioned therebetween. A backlight is provided outside the polarizing plate. As the backlight, a direct-lit backlight or an edge-lit backlight may be used. A direct-lit backlight including a light-emitting diode (LED) is preferably used because local dimming is easily performed to improve contrast. An edge-lit backlight is preferably used because the thickness of a module including the backlight can be reduced.

In the case where a reflective liquid crystal element is used, a polarizing plate is provided on the display surface side. In addition, a light diffusion plate is preferably provided on the display surface side to improve visibility.

In the case where a reflective or semi-transmissive liquid crystal element is used, a front light may be provided outside the polarizing plate. As the front light, an edge-lit front light is preferably used. A front light including an LED is preferably used because power consumption can be reduced.

[Light-Emitting Element]

As the light-emitting element, a self-luminous element can be used, and an element whose luminance is controlled by current or voltage is included in the category of the light-emitting element. For example, an LED, an organic EL element, or an inorganic EL element can be used.

The light-emitting element has a top-emission structure, a bottom-emission structure, a dual-emission structure, or the like. A conductive film that transmits visible light is used as an electrode through which light is extracted. A conductive film that reflects visible light is preferably used as an electrode through which light is not extracted.

The EL layer includes at least a light-emitting layer. In addition to the light-emitting layer, the EL layer may include a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

Either a low-molecular compound or a high-molecular compound can be used for the EL layer, and an inorganic compound may also be used. Each of the layers included in the EL layer can be formed by an evaporation method (including a vacuum evaporation method), a transfer method, a printing method, an inkjet method, a coating method, or the like.

When a voltage higher than the threshold voltage of the light-emitting element is applied between a cathode and an anode, holes from the anode side and electrons from the cathode side are injected into the EL layer. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, two or more light-emitting substances which emit light of complementary colors may be selected to obtain white light emission. Specifically, the EL layer preferably contains two or more light-emitting substances selected from light-emitting substances which emit light of red (R), green (G), blue (B), yellow (Y), orange (O), and the like and light-emitting substances which emit light including two or more spectral components of R, G, and B. The light-emitting element preferably emits light with a spectrum having two or more peaks in the wavelength range of a visible light region (e.g., 350 nm to 750 nm). It is preferable to use a material whose emission spectrum has a peak in a yellow wavelength region and includes spectral components also in green and red wavelength regions.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other, or a region which contains no light-emitting material may be provided between the stacked light-emitting layers. For example, between a fluorescent layer and a phosphorescent layer, a region which contains the same material (e.g., a host material or an assist material) as the fluorescent layer or the phosphorescent layer and contains no light-emitting material may be provided. This facilitates the manufacture of the light-emitting element and reduces the drive voltage.

The light-emitting element may be a single element including one EL layer or a tandem element in which a plurality of EL layers is stacked with a charge generation layer positioned therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium, an alloy containing the metal material, a nitride of the metal material (e.g., titanium nitride), or the like can be used when formed thin enough to transmit light. Alternatively, a stacked film of any of the above materials can be used as the conductive layer. For example, a stacked film of indium tin oxide and an alloy of silver and magnesium is preferably used because the conductivity can be increased. Alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing the metal material can be used. Lanthanum, neodymium, germanium, or the like may be added to the metal material or the alloy. Alternatively, an aluminum alloy may be used, namely an alloy containing aluminum and titanium, nickel, or neodymium. Alternatively, an alloy containing silver and copper, palladium, or magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material of the metal film or the metal oxide film include titanium and titanium oxide. Alternatively, the conductive film that transmits visible light and a film containing the metal material may be stacked. For example, a stacked film of silver and indium tin oxide or a stacked film of indium tin oxide and an alloy of silver and magnesium can be used.

The electrodes may each be formed by an evaporation method or a sputtering method. Alternatively, a discharging method such as an inkjet method, a printing method such as a screen printing method, or a plating method can be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may each contain an inorganic compound such as a quantum dot or a high-molecular compound (e.g., an oligomer, a dendrimer, or a polymer). For example, a quantum dot used for the light-emitting layer can function as a light-emitting material.

The quantum dot can be a colloidal quantum dot, an alloyed quantum dot, a core-shell quantum dot, a core quantum dot, or the like. A material containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives, e.g., a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Further alternatively, an adhesive sheet or the like may be used.

Furthermore, the resin may contain a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably contained because it can prevent impurities such as moisture from entering the element, thereby improving the reliability of the display panel.

In addition, a filler with a high refractive index or a light-scattering member may be mixed with the resin, in which case the light extraction efficiency can be improved. For example, titanium oxide, barium oxide, zeolite, or zirconium can be used.

[Connection Layer]

As the connection layer, an anisotropic conductive film (ACF), an anisotropic conductive paste (ACP), or the like can be used.

[Coloring Layer]

Examples of a material that can be used for the coloring layer include a metal material, a resin material, and a resin material containing a pigment or a dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stack of films containing materials of the coloring layers can also be used as the light-blocking layer. For example, a stacked structure of a film containing a material of a coloring layer that transmits light of a certain color and a film containing a material of a coloring layer that transmits light of another color can be employed. The coloring layer and the light-blocking layer are preferably formed using the same material because the same manufacturing apparatus can be used and the process can be simplified.

At least part of this embodiment can be implemented in combination with any of the other embodiments described in this specification as appropriate.

Embodiment 4

Examples of an electronic device for which the display system of one embodiment of the present invention can be used include display devices, personal computers, image storage devices or image reproducing devices provided with recording media, mobile phones, game consoles (including portable game consoles), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 20A to 20F show specific examples of these electronic devices.

Figure 20A:
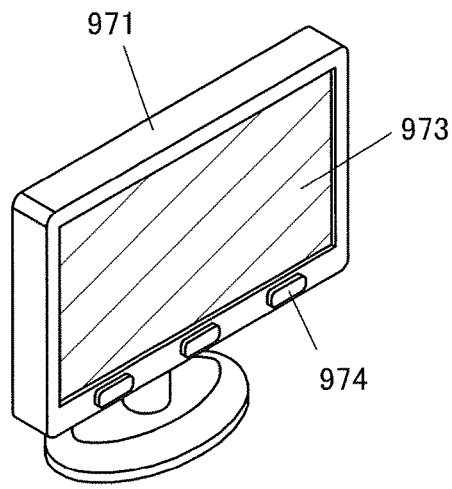
FIGS. 20A to 20F illustrate electronic devices.

FIG. 20A illustrates a navigation system which includes a housing 971, a display portion 973, an operation key 974, and the like. The display portion 973 is provided with a touch sensor with which general input operation can be performed. When the display system of one embodiment of the present invention is used for the display portion 973, the power consumption can be reduced.

Figure 20B:
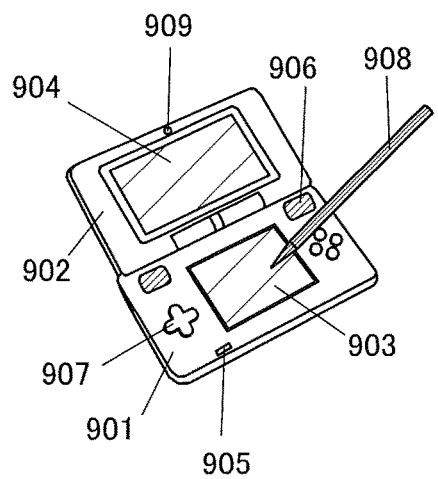

FIG. 20B illustrates a portable game console which includes a housing 901, a housing 902, a display portion 903, a display portion 904, a microphone 905, a speaker 906, an operation key 907, a stylus 908, a camera 909, and the like. Although the portable game console illustrated in FIG. 20B has the two display portions 903 and 904, the number of display portions included in the portable game console is not limited to two. When the display system of one embodiment of the present invention is used for the display portion 903, the power consumption can be reduced.

Figure 20C:
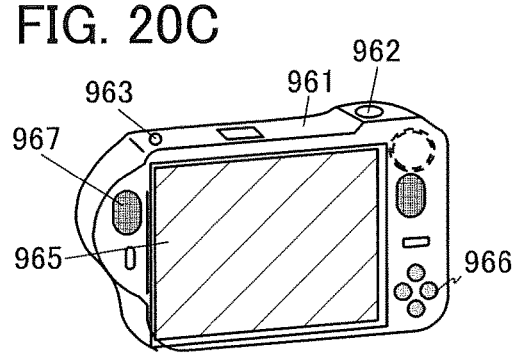

FIG. 20C illustrates a digital camera which includes a housing 961, a shutter button 962, a microphone 963, a speaker 967, a display portion 965, an operation key 966, and the like. When the display system of one embodiment of the present invention is used for the display portion 965, the power consumption can be reduced.

Figure 20D:
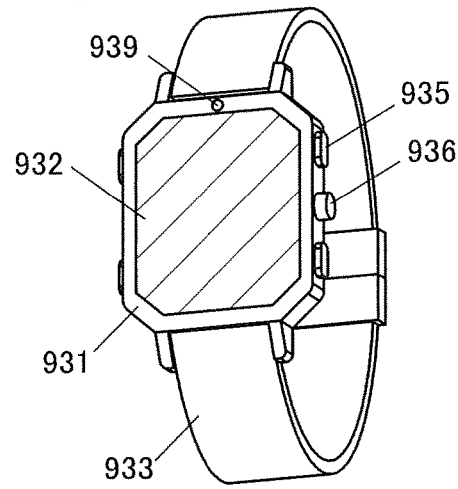

FIG. 20D illustrates a wrist-watch-type information terminal which includes a housing 931, a display portion 932, a wristband 933, an operation button 935, a crown 936, a camera 939, and the like. The display portion 932 may be a touch panel. When the display portion 932 includes the display system of one embodiment of the present invention, the power consumption can be reduced.

Figure 20E:
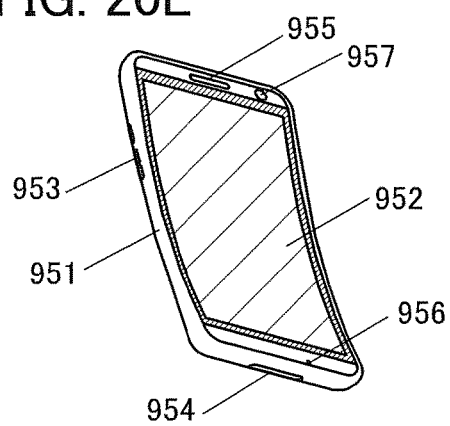

FIG. 20E shows an example of a mobile phone which includes a housing 951, a display portion 952, an operation button 953, an external connection port 954, a speaker 955, a microphone 956, a camera 957, and the like. The display portion 952 of the mobile phone includes a touch sensor. Operations such as making a call and inputting text can be performed by touch on the display portion 952 with a finger, a stylus, or the like. When the display system of one embodiment of the present invention is used for the display portion 952, the power consumption can be reduced.

Figure 20F:
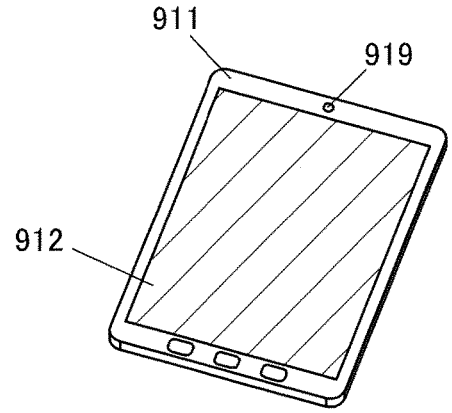

FIG. 20F illustrates a portable data terminal which includes a housing 911, a display portion 912, a camera 919, and the like. A touch panel function of the display portion 912 enables input and output of information. When the display system of one embodiment of the present invention is used for the display portion 932, the power consumption can be reduced.

At least part of this embodiment can be implemented in combination with any of the other embodiments described in this specification as appropriate.

This application is based on Japanese Patent Application Serial No. 2016-179155 filed with Japan Patent Office on Sep. 14, 2016, the entire contents of which are hereby incorporated by reference.

What is claimed is:

1. A display system comprising:
a display panel configured to display a first image, a second image, a third image, and a fourth image,
wherein the first image overlaps with the third image,
wherein the second image overlaps with the fourth image,
wherein the first image and the third image are perceived by one of right and left eyes and the second image and the fourth image are perceived by the other of the right and left eyes, so that a composite image of the first image, the second image, the third image, and the fourth image is stereoscopically perceivable,
wherein the first image and the third image are not horizontally aligned with each other, and
wherein the second image and the fourth image are not horizontally aligned with each other.

2. The display system according to claim 1,
wherein a size and a shape of the first image are substantially the same as a size and a shape of the third image, and
wherein a size and a shape of the second image are substantially the same as a size and a shape of the fourth image.

3. The display system according to claim 1,
wherein a luminance of the first image is higher than a luminance of the third image, and
wherein a luminance of the second image is higher than a luminance of the fourth image.

4. An electronic device comprising:
the display system according to claim 1; and
a touch sensor overlapping with the display panel.

5. A display system comprising:
a display panel comprising:
a first pixel comprising a first display element and a third display element;
a second pixel adjacent to the first pixel, the second pixel comprising a second display element and a fourth display element; and
a shielding layer which is apart from the first pixel and the second pixel, overlaps with the first pixel when seen from a first angle, and overlaps with the second pixel when seen from a second angle,
wherein the first display element is configured to display a first image,
wherein the second display element is configured to display a second image,
wherein the third display element is configured to display a third image,
wherein the fourth display element is configured to display a fourth image,
wherein the first image overlaps with the third image,
wherein the second image overlaps with the fourth image,
wherein the first pixel is perceived by one of right and left eyes and the second pixel is perceived by the other of the right and left eyes, so that a composite image of the first image, the second image, the third image, and the fourth image is stereoscopically perceivable,
wherein the first image and the third image are not horizontally aligned with each other, and
wherein the second image and the fourth image are not horizontally aligned with each other.

6. The display system according to claim 5,
wherein a size and a shape of the first image are substantially the same as a size and a shape of the third image, and
wherein a size and a shape of the second image are substantially the same as a size and a shape of the fourth image.

7. The display system according to claim 5,
wherein a luminance of the first image is higher than a luminance of the third image, and
wherein a luminance of the second image is higher than a luminance of the fourth image.

8. The display system according to claim 5,
wherein a black image is displayed by the third display element in a region in which the first image is displayed and does not overlap with the third image,
wherein a black image is displayed by the first display element in a region in which the third image is displayed and does not overlap with the first image,
wherein a black image is displayed by the fourth display element in a region in which the second image is displayed and does not overlap with the fourth image, and
wherein a black image is displayed by the second display element in a region in which the fourth image is displayed and does not overlap with the second image.

9. The display system according to claim 5, wherein the first display element and the second display element are each configured to reflect visible light.

10. The display system according to claim 5, wherein the third display element and the fourth display element are each configured to emit visible light.

11. The display system according to claim 5, wherein the first display element, the second display element, the third display element, and the fourth display element are each electrically connected to a transistor including an oxide semiconductor layer.

12. An electronic device comprising:
the display system according to claim 5; and
a touch sensor overlapping with the display panel.

13. A display system comprising:
a display panel comprising:
a first pixel comprising a first display element and a third display element;
a second pixel adjacent to the first pixel, the second pixel comprising a second display element and a fourth display element; and
a shielding layer which is apart from the first pixel and the second pixel, overlaps with the first pixel when seen from a first angle, and overlaps with the second pixel when seen from a second angle,
wherein the first display element is configured to display a first image,
wherein the second display element is configured to display a second image,
wherein the third display element is configured to display a third image, wherein the fourth display element is configured to display a fourth image,
wherein the first image overlaps with the third image,
wherein the second image overlaps with the fourth image,
wherein the first pixel is perceived by one of right and left eyes and the second pixel is perceived by the other of the right and left eyes, so that a composite image of the first image, the second image, the third image, and the fourth image is stereoscopically perceivable,
wherein a black image is displayed by the third display element in a region in which the first image is displayed and does not overlap with the third image,
wherein a black image is displayed by the first display element in a region in which the third image is displayed and does not overlap with the first image,
wherein a black image is displayed by the fourth display element in a region in which the second image is displayed and does not overlap with the fourth image, and
wherein a black image is displayed by the second display element in a region in which the fourth image is displayed and does not overlap with the second image.

14. An electronic device comprising:
the display system according to claim 13; and
a touch sensor overlapping with the display panel.

15. A display system comprising:
a display panel comprising:
a first pixel comprising a first display element and a third display element;
a second pixel adjacent to the first pixel, the second pixel comprising a second display element and a fourth display element; and
a shielding layer which is apart from the first pixel and the second pixel, overlaps with the first pixel when seen from a first angle, and overlaps with the second pixel when seen from a second angle,
wherein the first display element is configured to display a first image,
wherein the second display element is configured to display a second image,
wherein the third display element is configured to display a third image,
wherein the fourth display element is configured to display a fourth image,
wherein the first image overlaps with the third image,
wherein the second image overlaps with the fourth image,
wherein the first pixel is perceived by one of right and left eyes and the second pixel is perceived by the other of the right and left eyes, so that a composite image of the first image, the second image, the third image, and the fourth image is stereoscopically perceivable, and
wherein the first display element and the second display element are each configured to reflect visible light.

16. An electronic device comprising:
the display system according to claim 15; and
a touch sensor overlapping with the display panel.

* * * * *